United States Patent
Ito

(10) Patent No.: US 9,620,541 B2
(45) Date of Patent: Apr. 11, 2017

(54) SOLID-STATE IMAGE PICKUP APPARATUS AND ELECTRONIC APPARATUS

(71) Applicant: Sony Corporation, Tokyo (JP)

(72) Inventor: Kyosuke Ito, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 109 days.

(21) Appl. No.: 14/319,686

(22) Filed: Jun. 30, 2014

(65) Prior Publication Data

US 2015/0015749 A1      Jan. 15, 2015

(30) Foreign Application Priority Data

Jul. 11, 2013   (JP) ................................ 2013-145817

(51) Int. Cl.
*H01L 27/146*      (2006.01)
*H04N 9/04*          (2006.01)
*H04N 5/369*        (2011.01)

(52) U.S. Cl.
CPC .. *H01L 27/14623* (2013.01); *H01L 27/14627* (2013.01); *H01L 27/14629* (2013.01); *H04N 5/3696* (2013.01); *H04N 9/045* (2013.01)

(58) Field of Classification Search
CPC ...... H04N 5/357; H04N 5/359; H04N 5/3591; H04N 5/3592; H04N 5/3594; H04N 5/3595; H04N 5/3598; H04N 5/3696; H04N 9/045; H01L 27/14629; H01L 27/14627; H01L 27/14623; H01L 2027/11892
USPC ....................................................... 348/273
See application file for complete search history.

(56) References Cited

U.S. PATENT DOCUMENTS

| | | | | |
|---|---|---|---|---|
| 8,878,325 B2 * | 11/2014 | Wan | ................... | H01L 27/14634 257/431 |
| 2011/0279727 A1 * | 11/2011 | Kusaka | ............. | H01L 27/14621 348/340 |
| 2013/0083225 A1 * | 4/2013 | Minowa | ............ | H01L 27/14607 348/294 |
| 2013/0083230 A1 * | 4/2013 | Fukuda | .............. | H04N 5/35563 348/340 |
| 2013/0113061 A1 * | 5/2013 | Lai | ...................... | H01L 27/1463 257/432 |
| 2013/0307040 A1 * | 11/2013 | Ahn | ..................... | H01L 27/1463 257/292 |
| 2013/0321685 A1 * | 12/2013 | Ahn | ....................... | H04N 5/374 348/308 |
| 2014/0035083 A1 * | 2/2014 | Wan | .................. | H01L 27/14634 257/432 |
| 2014/0055650 A1 * | 2/2014 | Hiramoto | .......... | H01L 27/14627 348/280 |

(Continued)

FOREIGN PATENT DOCUMENTS

| | | |
|---|---|---|
| JP | 2009-157198 | 7/2009 |
| JP | 2009-206356 | 9/2009 |
| JP | 2013-080797 | 5/2013 |

OTHER PUBLICATIONS

Japanese Patent Office Action dated Dec. 1, 2016 corresponding to Japanese Serial No. 2013-145817.

*Primary Examiner* — Pritham Prabhakher
(74) *Attorney, Agent, or Firm* — Dentons US LLP

(57) ABSTRACT

Provided is a solid-state image pickup apparatus including a crosstalk suppression mechanism included in each pixel arranged in a pixel array, the crosstalk suppression mechanism of a part of the pixels differing from that of other pixels in an effective area of the pixel array.

11 Claims, 15 Drawing Sheets

(56) References Cited

U.S. PATENT DOCUMENTS

2014/0183606 A1\* 7/2014 Kakehi ............ H01L 27/14689
　　　　　　　　　　　　　　　　　　　　　257/290
2014/0291481 A1\* 10/2014 Zhang .................... H04N 5/361
　　　　　　　　　　　　　　　　　　　　　250/208.1

\* cited by examiner

SOLID-STATE IMAGE PICKUP APPARATUS AND ELECTRONIC APPARATUS

CROSS REFERENCE TO RELATED APPLICATIONS

This application claims the benefit of Japanese Priority Patent Application JP 2013-145817 filed Jul. 11, 2013, the entire contents of which are incorporated herein by reference.

BACKGROUND

The present disclosure relates to a solid-state image pickup apparatus and an electronic apparatus, more particularly, to a solid-state image pickup apparatus and an electronic apparatus with which a correction of a pixel signal can be avoided as much as possible and an image plane phase difference AF can be executed appropriately.

In recent years, cameras adopt an image plane phase difference AF for both a model miniaturization and an AF (autofocus) function.

In the image plane phase difference AF, the AF is performed by arranging a plurality of pixels in which left, right, top, and bottom of an opening portion of a photodiode (PD) are partially optically shielded in an angle of view and acquiring a phase difference signal from those pixels.

Since an AF speed is higher than that of a contrast AF system and there is no need to mount an AF image pickup device, the image plane phase difference AF is effective in miniaturizing the camera and lowering costs.

The image plane phase difference AF pixels (also referred to as phase difference pixels) have a pixel structure in which about half of the PD on the left and right or at the top and bottom is optically shielded. The phase difference pixels are arranged in a pair (do not always need to be adjacent to each other), and the two phase difference pixels generate a single phase difference signal from different oblique incidence characteristics thereof (see, for example, Japanese Patent Application Laid-open No. 2009-157198).

SUMMARY

However, in the image plane phase difference AF of the related art, a sensitivity of the phase difference pixels is always lower than that of normal pixels, and it has been difficult to use an output signal for image pickup.

Therefore, for obtaining a pixel signal corresponding to pixel positions of the phase difference pixels in the related art, it has been necessary to perform a defect correction.

Further, when a density of the phase difference pixels is raised for raising AF characteristics, there is a fear that a defective pixel stands out or a circuit scale becomes large. Furthermore, since crosstalk due to a reflection by a light shield film occurs also in normal pixels adjacent to the phase difference pixels, a crosstalk correction has also been necessary.

The present disclosure has been made in view of the circumstances as described above, and thus there is a need for a technique with which a pixel signal correction can be avoided as much as possible and an image plane phase difference AF can be executed appropriately.

According to an embodiment of the present disclosure, there is provided a solid-state image pickup apparatus including a crosstalk suppression mechanism included in each pixel arranged in a pixel array, the crosstalk suppression mechanism of a part of the pixels differing from that of other pixels in an effective area of the pixel array.

The crosstalk suppression mechanism may be a DTI.

The part of the pixels in the effective area of the pixel array may be a plurality of phase difference pixels for obtaining a phase difference signal used in an image plane phase difference AF, and the DTI around a pixel surrounded by the phase difference pixels may be removed.

The part of the pixels in the effective area of the pixel array may be a plurality of phase difference pixels for obtaining a phase difference signal used in an image plane phase difference AF, and the DTI may be provided only around a pixel surrounded by the phase difference pixels.

The crosstalk suppression mechanism may be realized by adjusting an ion implantation amount for the pixels arranged in the pixel array.

The part of the pixels in the effective area of the pixel array may be a plurality of phase difference pixels for obtaining a phase difference signal used in an image plane phase difference AF, and an ion implantation amount for an electronic barrier of a pixel surrounded by the phase difference pixels may be smaller than that for an electronic barrier of other pixels.

The part of the pixels in the effective area of the pixel array may be a plurality of phase difference pixels for obtaining a phase difference signal used in an image plane phase difference AF, and an ion implantation amount for a sensor area of a pixel surrounded by the phase difference pixels may be smaller than that for an electronic barrier of other pixels.

The crosstalk suppression mechanism may be an OBB, the part of the pixels in the effective area of the pixel array may be a plurality of phase difference pixels for obtaining a phase difference signal used in an image plane phase difference AF, and the OBB of a pixel surrounded by the phase difference pixels may be removed.

The crosstalk suppression mechanism may be a waveguide, the part of the pixels in the effective area of the pixel array may be a plurality of phase difference pixels for obtaining a phase difference signal used in an image plane phase difference AF, and the waveguide of a pixel surrounded by the phase difference pixels may be removed.

The crosstalk suppression mechanism may be an on-chip lens, the part of the pixels in the effective area of the pixel array may be a plurality of phase difference pixels for obtaining a phase difference signal used in an image plane phase difference AF, and the on-chip lens of a pixel surrounded by the phase difference pixels may be structured such that a light collection property thereof becomes weak.

The crosstalk suppression mechanism may be realized by a color filter, the part of the pixels in the effective area of the pixel array may be a plurality of phase difference pixels for obtaining a phase difference signal used in an image plane phase difference AF, and only the color filter of a pixel surrounded by the phase difference pixels may be white.

The part of the pixels in the effective area of the pixel array may be a plurality of phase difference pixels for obtaining a phase difference signal used in an image plane phase difference AF, and the color filters of the same color may be arranged for the phase difference pixels.

The part of the pixels in the effective area of the pixel array may be a plurality of phase difference pixels for obtaining a phase difference signal used in an image plane phase difference AF, and a pixel adjacent to a predetermined pixel in a vertical direction and a pixel adjacent to the predetermined pixel in a horizontal direction out of the pixels of the pixel array arranged in a 2D matrix may be the phase difference pixels.

The part of the pixels in the effective area of the pixel array may be a plurality of phase difference pixels for obtaining a phase difference signal used in an image plane phase difference AF, two pixels adjacent to each other in a vertical direction and two pixels adjacent to each other in a horizontal direction out of the pixels of the pixel array arranged in a 2D matrix may be the phase difference pixels, and the two pixels adjacent to each other in the vertical direction and the two pixels adjacent to each other in the horizontal direction may be arranged in an L shape.

According to another embodiment of the present disclosure, there is provided an electronic apparatus including a solid-state image pickup apparatus. The solid-state image pickup apparatus includes a crosstalk suppression mechanism included in each pixel arranged in a pixel array, the crosstalk suppression mechanism of a part of the pixels differing from that of other pixels in an effective area of the pixel array.

According to the embodiments of the present disclosure, regarding the crosstalk suppression mechanism included in each pixel arranged in the pixel array, the crosstalk suppression mechanism of a part of the pixels differs from that of other pixels in the effective area of the pixel array.

According to the embodiments of the present disclosure, it is possible to avoid a pixel signal correction as much as possible and appropriately execute the image plane phase difference AF.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present disclosure will be described with reference to the drawings.

Figure 1:
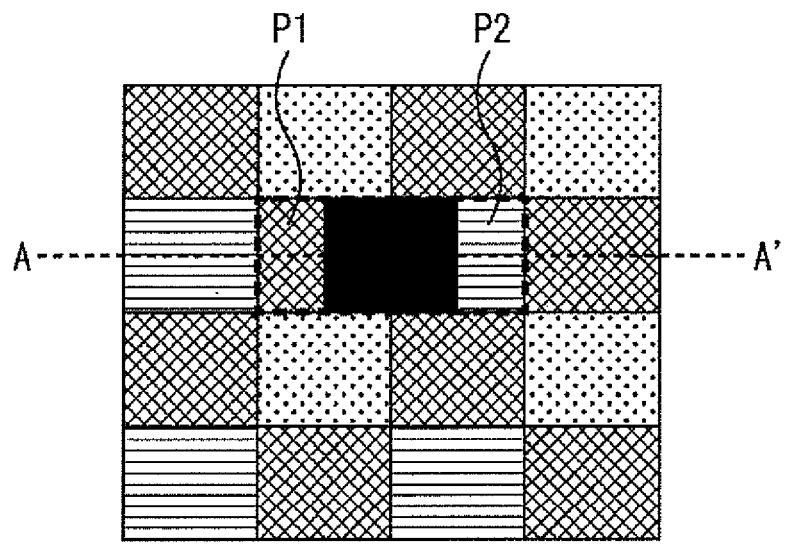
FIG. 1 is a plan view showing a structural example of phase difference pixels arranged in a pixel portion of an image sensor used in an image plane phase difference AF of the related art.

FIG. 1 is a plan view showing a structural example of phase difference pixels arranged in a pixel portion of an image sensor used in an image plane phase difference AF (autofocus) of the related art. As shown in FIG. 1, in the pixel portion of the image sensor, a plurality of pixels illustrated as rectangles in the figure are arranged in a 2D matrix.

Such a pixel portion is structured as a pixel array of the image sensor. Here, a part of the pixels arranged in an effective area of the pixel array are shown.

As shown in the figure, pixels in which half of an opening portion of a photodiode (PD) is optically shielded are arranged as phase difference pixels. The phase difference pixels are arranged in a pair (do not always need to be adjacent to each other), and the two phase difference pixels generate a single phase difference signal based on different oblique incidence characteristics thereof.

Here, the phase difference signal refers to one pixel signal output by the two phase difference pixels.

For example, a focal point detection area is set in an effective pixel area of a light reception area in the image sensor. In the image plane phase difference AF, a focus position of a lens is detected based on the phase difference signal output by the phase difference pixels in the focal point detection area.

At this time, for obtaining a phase difference signal used in detecting the focus position, the phase difference pixels are structured to have different oblique incidence characteristics.

In the example of FIG. 1, a phase difference pixel P1 and a phase difference pixel P2 are provided. A right half of the opening portion of the phase difference pixel P1 in the figure is blackened, and by providing a light shield film at this portion, light is shielded. Moreover, a left half of the opening portion of the phase difference pixel P2 in the figure is blackened, and by providing a light shield film at this portion, light is shielded.

In the case of the structure shown in FIG. 1, since the phase difference pixel P1 is optically shielded at the right half of the opening portion, a light reception sensitivity with respect to light that enters from an upper left-hand direction is high while the light reception sensitivity with respect to light that enters from an upper right-hand direction is low. In contrast, since the phase difference pixel P2 is optically shielded at the left half of the opening portion, a light reception sensitivity with respect to light that enters from an upper right-hand direction is high while the light reception sensitivity with respect to light that enters from an upper left-hand direction is low.

As described above, in the case of the structure shown in FIG. 1, the phase difference pixel P1 and the phase difference pixel P2 are structured to have different oblique incidence characteristics.

It should be noted that although the two phase difference pixels are arranged in the lateral direction in the figure, the two phase difference pixels are also arranged in the longitudinal direction in the figure in actuality. In other words, the phase difference pixel P1 and the phase difference pixel P2 are phase difference pixels for obtaining a phase difference signal in the lateral direction (horizontal direction), and phase difference pixels for obtaining a phase difference signal in the longitudinal direction (vertical direction) are also provided.

However, since half of the opening portion of the phase difference pixels is optically shielded when structuring the phase difference pixels as shown in FIG. 1, a value of a pixel signal output from the phase difference pixels becomes smaller than that of a pixel signal output from other pixels in the effective area (referred to as normal pixels) even in the case of pixel signals corresponding to the same light reception amount.

Therefore, in the image plane phase difference AF of the related art, the phase difference pixels have been handled as defective pixels, and defect correction processing of predictively generating a pixel signal of phase difference pixels has been carried out based on a pixel signal of pixels adjacent to the phase difference pixels, for example.

Further, when a light shield film is provided as shown in FIG. 1, light is reflected by the light shield film, and thus the reflected light may enter peripheral pixels. Therefore, in the image plane phase difference AF of the related art, crosstalk correction processing for removing crosstalk components due to an incorporation of light reflected by the light shield film has been carried out on a pixel signal output from pixels adjacent to the phase difference pixels, for example.

In this regard, the present disclosure aims at enabling a correction of a pixel signal to be avoided as much as possible and the image plane phase difference AF to be executed appropriately.

Figure 2:
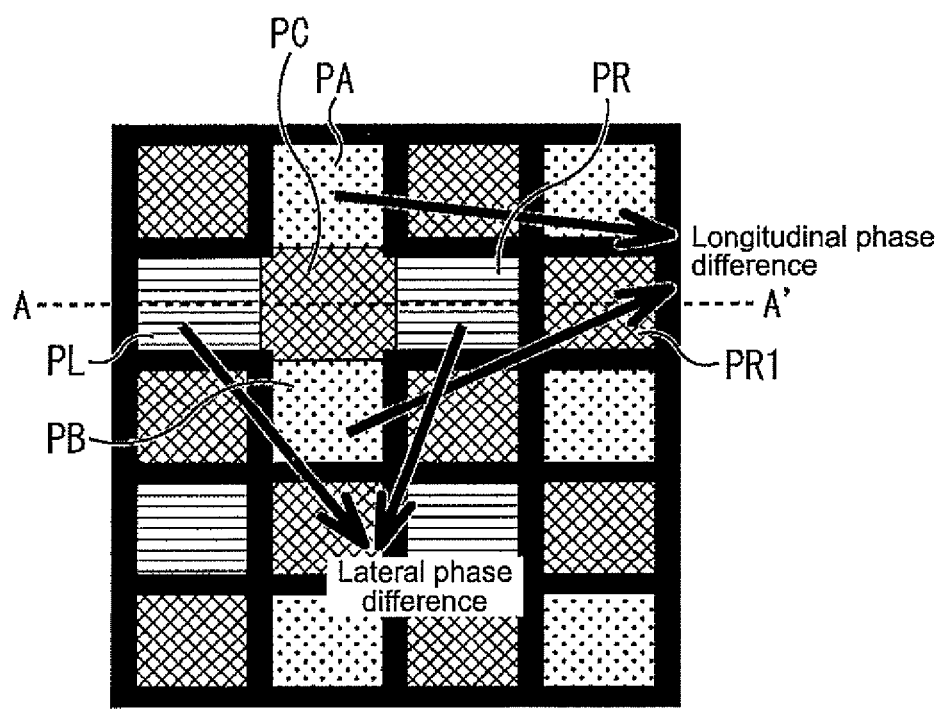
FIG. 2 is a diagram showing a structural example of a pixel portion of an image sensor to which the present disclosure is applied.

FIG. 2 is a diagram showing a structural example of a pixel portion of an image sensor to which the present disclosure is applied. As shown in the figure, a plurality of pixels illustrated as rectangles in the figure are arranged in the pixel portion of the image sensor in a 2D matrix.

Such a pixel portion is structured as a pixel array of the image sensor. Here, a part of the pixels arranged in the effective area of the pixel array are shown.

In this example, a DTI (Deep Trench Isolation) is adopted for the image sensor. The DTI is a technique of forming a trench between pixels and embedding an oxide film therein to thus suppress an incorporation of charges among the pixels and the like. In other words, the DTI is adopted as a crosstalk suppression mechanism for suppressing crosstalk that occurs due to incident light entering adjacent pixels, an incorporation of a pixel signal of adjacent pixels, and the like in the image sensor.

In FIG. 2, black frame borders drawn along the rectangles indicate the DTI. In this example, a pixel PL and pixel PR and a pixel PA and pixel PB are the phase difference pixels. Specifically, a lateral phase difference signal is obtained by the phase difference pixel PL and the phase difference pixel PR, and a longitudinal phase difference signal is obtained by the phase difference pixel PA and the phase difference pixel PB.

Although the DTI is arranged on 4 sides of the rectangular pixel in principle in the structure shown in FIG. 2, the DTI is not exceptionally arranged on 4 sides of a pixel PC arranged at the center of the 4 phase difference pixels, that is, the phase difference pixel PL, the phase difference pixel PR, the phase difference pixel PA, and the phase difference pixel PB.

Figure 3:
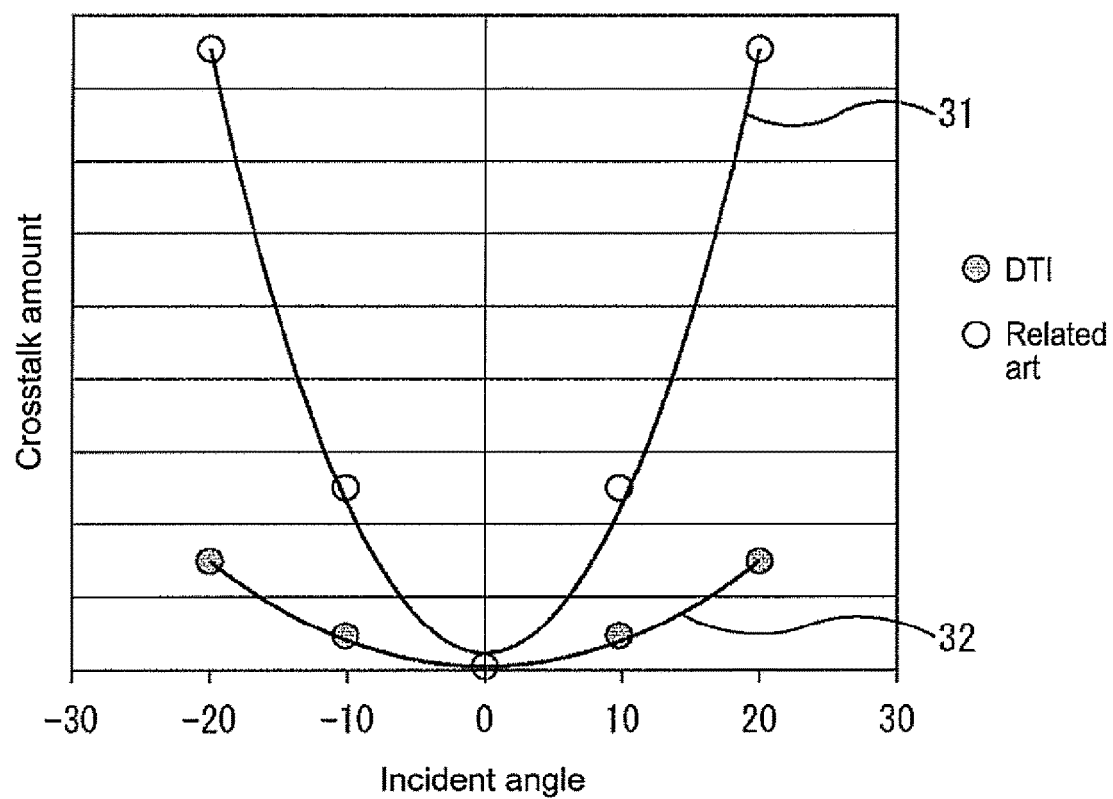
FIG. 3 is a diagram for explaining a crosstalk suppression effect of a DTI.

FIG. 3 is a diagram for explaining a crosstalk suppression effect of the DTI. In the figure, the abscissa axis represents a light incident angle, and the ordinate axis represents a crosstalk amount. The curve 31 represents a change of the crosstalk amount accompanying a change of the light incident angle of the image sensor in which a DTI is not provided, and the curve 32 represents a change of the crosstalk amount accompanying a change of the light incident angle of the image sensor in which a DTI is provided.

As shown in FIG. 3, the curve 32 shows that the change of the crosstalk amount accompanying the change of the light incident angle is more gradual than the curve 31. In other words, in the image sensor in which a DTI is not provided, (an absolute value of) the light incident angle becomes large, and when light enters obliquely, the crosstalk amount increases prominently. In contrast, in the image sensor in which a DTI is provided, it can be seen that the crosstalk amount does not increase much even when light enters obliquely.

In the present disclosure, crosstalk that occurs due to incident light entering adjacent pixels, an incorporation of a pixel signal of adjacent pixels, and the like is used in place of the oblique incidence characteristics of the phase difference pixels. Specifically, in the present disclosure, the phase difference pixels are structured to have different crosstalk amounts for obtaining a phase difference signal used in detecting a focus position.

Figure 4:
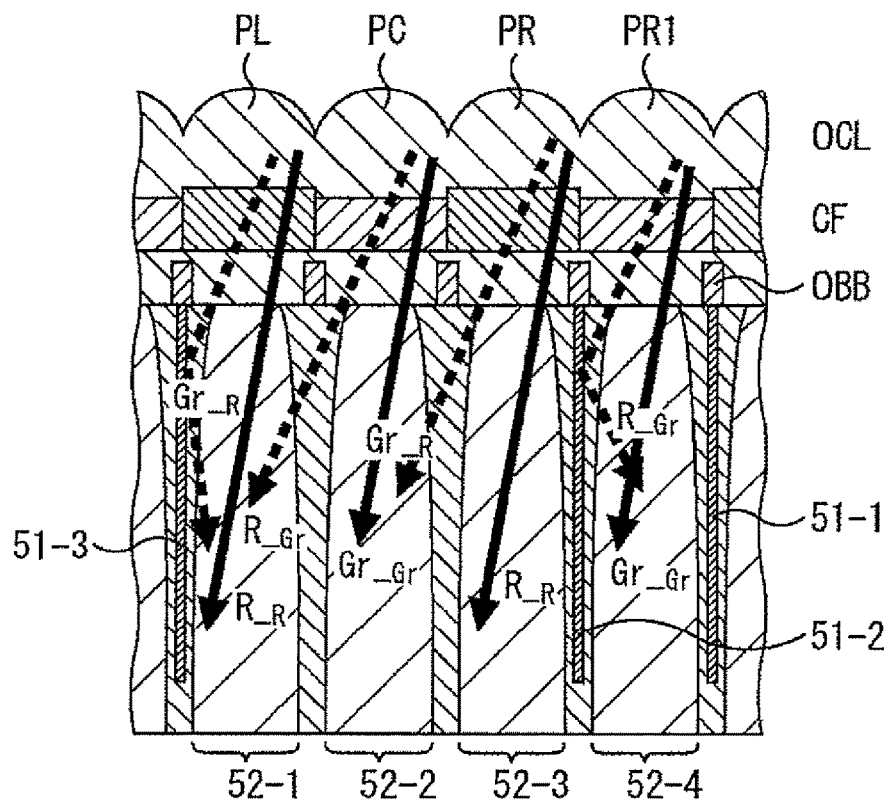
FIG. 4 is a cross-sectional diagram of the pixel portion of the image sensor shown in FIG. 2 taken along the line A-A'.

FIG. 4 is a cross-sectional diagram of the pixel portion of the image sensor shown in FIG. 2 taken along the line A-A' and is a diagram for explaining a difference in the crosstalk amounts of the phase difference pixels shown in FIG. 2.

FIG. 4 shows a cross-sectional diagram of the phase difference pixel PL, the phase difference pixel PR, the pixel PC, and a pixel PR1 located on the right-hand side of the phase difference pixel PR in FIG. 2.

As shown in FIG. 4, an on-chip lens (OCL) and a color filter (CF) are arranged in each pixel, and OBB for preventing stray light is provided under the CF. Here, a Bayer arrangement is adopted for the pixel portion, and the pixels respectively correspond to color components of red (R), green (Gr, Gb), and blue (B). For example, a red CF is arranged in the phase difference pixel PL, a green CF is arranged in the pixel PC, a red CF is arranged in the phase difference pixel PR, and a green CF is arranged in the pixel PR1. Light that has passed through the OCLs and CFs enters the sensor areas of the sensors.

It is assumed that light whose direction from the upper right to the lower left becomes dominant in FIG. 4 is entering the pixel portion. In this case, for example, regarding the pixel corresponding to the green color component, an optical component to be absorbed by the sensor area of the pixel itself and an optical component that is to be incorporated into the sensor area of the pixel on the immediate left, that corresponds to the red color component, enter that pixel. Here, the optical component to be absorbed by the sensor area of the pixel itself is represented by $Gr_{-Gr}$, and the optical component to be incorporated into the sensor area of the pixel on the immediate left, that corresponds to the red color component, is represented by $R_{-Gr}$.

Further, for example, regarding the pixel corresponding to the red color component, an optical component to be absorbed by the sensor area of the pixel itself and an optical component that is to be incorporated into the sensor area of the pixel on the immediate left, that corresponds to the green color component, enter that pixel. Here, the optical component to be absorbed by the sensor area of the pixel itself is represented by $R_{-R}$, and the optical component to be incorporated into the sensor area of the pixel on the immediate left, that corresponds to the green color component, is represented by $G_{-R}$.

In the case of the example shown in FIG. 4, regarding the pixel PR1 corresponding to the green color component, the optical component $Gr_{-Gr}$ to be absorbed by the sensor area 52-4 of the pixel itself and the optical component $R_{-Gr}$ to be incorporated into the sensor area of the pixel on the immediate left, that corresponds to the red color component, enter that pixel. However, the component $R_{-Gr}$ is suppressed from entering by the DTI 51-2 and is thus absorbed by the sensor area 52-4 of the pixel itself.

Moreover, regarding the phase difference pixel PR corresponding to the red color component, the optical component $R_{-R}$ to be absorbed by the sensor area 52-3 of the pixel itself and the optical component $Gr_{-R}$ to be incorporated into the sensor area 52-2 of the pixel on the immediate left, that corresponds to the green color component, enter that pixel. In this case, since the DTI is not provided between the phase difference pixel PR and the pixel PC, the component $Gr_{-R}$ enters the sensor area 52-2 of the pixel PC as it is.

Furthermore, regarding the pixel PC corresponding to the green color component, the optical component $Gr_{-Gr}$ to be absorbed by the sensor area 52-2 of the pixel itself and the optical component $R_{-Gr}$ to be incorporated into the sensor area 52-1 of the pixel on the immediate left, that corresponds to the red color component, enter that pixel. In this case, since the DTI is not provided between the phase difference pixel PL and the pixel PC, the component $Gr_{-R}$ enters the sensor area 52-1 of the phase difference pixel PL as it is.

Furthermore, regarding the phase difference pixel PL corresponding to the red color component, the optical component $R_{-R}$ to be absorbed by the sensor area 52-1 of the pixel itself and the optical component $G_{-R}$ to be incorporated into the sensor area 52-1 of the pixel on the immediate left, that corresponds to the green color component, enter that pixel. However, the component $Gr_{-R}$ is suppressed from entering by the DTI 51-3 and is thus absorbed by the sensor area 52-1 of the pixel itself.

As a result, in the sensor area 52-3 of the phase difference pixel PR, only the optical component $R_{-R}$ is absorbed and photoelectrically converted, and in the sensor area 52-1 of the phase difference pixel PL, the optical component $R_{-R}$ and the component $Gr_{-R}$ that has been incorporated from the pixel PC is absorbed and photoelectrically converted in addition to the component $G_{-R}$. Consequently, in the case where light whose direction from the upper right to the lower left becomes dominant is entering the pixel portion, the value of the pixel signal output from the phase difference pixel PR becomes small, and the value of the pixel signal output from the phase difference pixel PL becomes large.

It should be noted that when light whose direction from the upper left to the lower right becomes dominant is entering the pixel portion, the value of the pixel signal output from the phase difference pixel PR becomes large, and the value of the pixel signal output from the phase difference pixel PL becomes small in contradiction to the example above.

In other words, while the phase difference pixel PL has a high light reception sensitivity with respect to light that enters from the upper right, it has a low light reception sensitivity with respect to light that enters from the upper left. In contrast, while the phase difference pixel PR has a high light reception sensitivity with respect to light that enters from the upper left, it has a low light reception sensitivity with respect to light that enters from the upper right. This is because the crosstalk amounts caused by incident light entering adjacent pixels, an incorporation of a pixel signal from adjacent pixels, and the like at a time light that has entered from the same direction is received differ for the phase difference pixel PL and the phase difference pixel PR.

Moreover, as shown in FIG. 2, since the DTI is not provided between the phase difference pixel PA and the pixel PC and also between the phase difference pixel PB and the pixel PC, the phase difference pixel PA and the phase difference pixel PB also have different light reception sensitivities.

As described above, according to the present disclosure, a phase difference signal can be obtained without providing a light shield film. In other words, since the light shield film is not provided in the phase difference pixels, the value of the pixel signal output from the phase difference pixels does not become extremely smaller than that of the pixel signal output from normal pixels. Therefore, in the present disclosure, there is no need to handle the phase difference pixels as defective pixels and carry out the defect correction processing.

Further, according to the present disclosure, there is also no need to carry out the crosstalk correction processing for removing crosstalk components due to entering of light reflected by the light shield film.

The structure in which the DTI is arranged on 4 sides of a rectangular pixel in principle and the DTI is not arranged exceptionally on 4 sides of the pixel PC arranged at the center of the 4 phase difference pixels has been described with reference to FIG. 2. However, a structure in which the DTI is not arranged on 4 sides of a rectangular pixel in principle and the DTI is arranged exceptionally on 4 sides of the pixel PC arranged at the center of the 4 phase difference pixels may be used instead.

Figure 5:
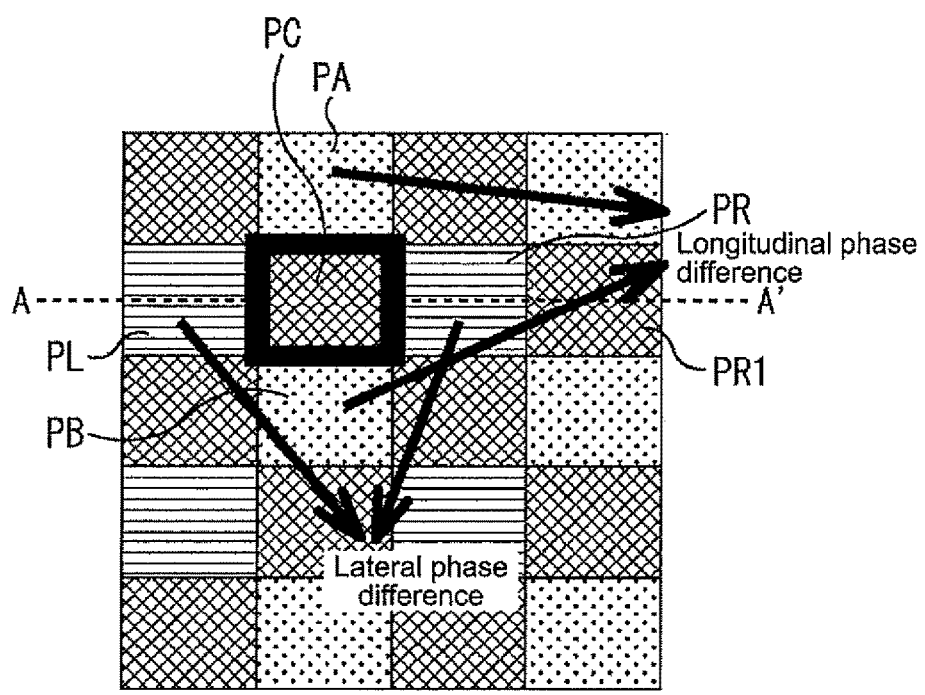
FIG. 5 is a diagram showing another structural example of the pixel portion of the image sensor to which the present disclosure is applied.

FIG. 5 is a diagram showing another structural example of the pixel portion of the image sensor to which the present disclosure is applied. Such a pixel portion is structured as a pixel array of the image sensor. Here, a part of the pixels arranged in the effective area of the pixel array are shown.

In this example, the DTI is not arranged on 4 sides of a rectangular pixel in principle, and the DTI is arranged exceptionally on 4 sides of the pixel PC arranged at the center of the 4 phase difference pixels. It should be noted that in FIG. 5, the black frame border drawn along the rectangle indicates the DTI.

Figure 6:
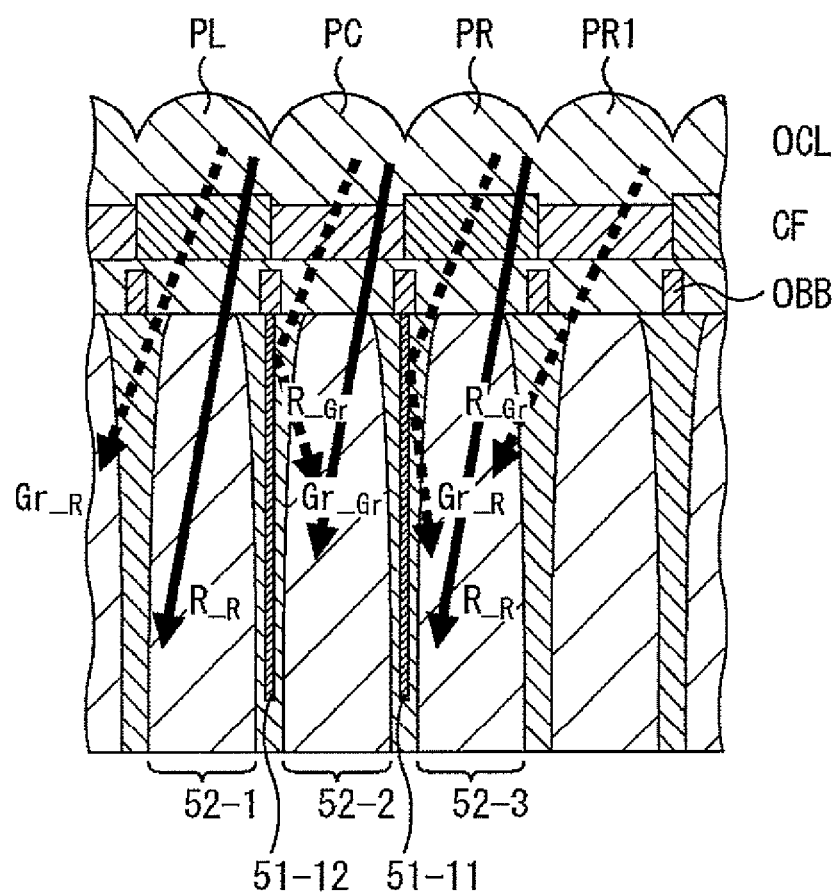
FIG. 6 is a cross-sectional diagram of the pixel portion of the image sensor shown in FIG. 5 taken along the line A-A'.

FIG. 6 is a cross-sectional diagram of the pixel portion of the image sensor shown in FIG. 5 taken along the line A-A' and is a diagram for explaining a difference between the crosstalk amounts of the phase difference pixels shown in FIG. 5.

In the case of FIG. 6, the Bayer arrangement is adopted for the pixel portion as in the case of FIG. 4, and the pixels respectively correspond to the color components of red (R), green (Gr, Gb), and blue (B). For example, a red CF is arranged in the phase difference pixel PL, a green CF is arranged in the pixel PC, a red CF is arranged in the phase difference pixel PR, and a green CF is arranged in the pixel PR1.

It is assumed that light whose direction from the upper right to the lower left becomes dominant in FIG. 6 is entering the pixel portion.

In the case of the example shown in FIG. 6, although the optical component $R_{-Gr}$ to be incorporated into the sensor area 52-3 of the phase difference pixel PR on the immediate left, that corresponds to the red color component, enters the pixel PR1 corresponding to the green color component, since the DTI is not provided between the pixel PR1 and the phase difference pixel PR, the component $R_{-Gr}$ is incorporated into the sensor area 52-3 of the phase difference pixel PR as it is.

Further, in the case of the example shown in FIG. 6, regarding the phase difference pixel PR corresponding to the red color component, the optical component $R_{-R}$ to be absorbed by the sensor area 52-3 of the pixel itself and the optical component $Gr_{-R}$ to be incorporated into the sensor area 52-2 of the pixel PC on the immediate left, that corresponds to the green color component, enter that pixel. However, the component $Gr_{-R}$ is suppressed from entering by the DTI 51-11 and is thus absorbed by the sensor area 52-3 of the pixel itself.

Furthermore, in the case of the example shown in FIG. 6, regarding the pixel PC corresponding to the green color component, the optical component $Gr_{-Gr}$ to be absorbed by the sensor area 52-2 of the pixel itself and the optical component $R_{-Gr}$ to be incorporated into the sensor area 52-1 of the phase difference pixel PL on the immediate left, that corresponds to the red color component, enter that pixel. However, the component $R_{-Gr}$ is suppressed from entering by the DTI 51-12 and is thus absorbed by the sensor area 52-2 of the pixel itself.

Furthermore, in the case of the example shown in FIG. 6, regarding the phase difference pixel PL corresponding to the red color component, the optical component $R_{-R}$ to be absorbed by the sensor area 52-1 of the pixel itself and the optical component $G_{-R}$ to be incorporated into the sensor area of the pixel on the immediate left, that corresponds to the green color component, enter that pixel. In this case, since the DTI is not provided between the phase difference pixel PL and the pixel on the immediate left, the component $Gr_{-R}$ enters the sensor area of the pixel on the immediate left as it is.

As a result, in the sensor area 52-1 of the phase difference pixel PL, only the optical component $R_{-R}$ is absorbed and photoelectrically converted, and in the sensor area 52-3 of the phase difference pixel PR, the optical component $R_{-R}$ and the component $Gr_{-R}$ that has been incorporated from the pixel PR1 is absorbed and photoelectrically converted in addition to the component $G_{-R}$. Consequently, in the case where light whose direction from the upper right to the lower left becomes dominant is entering the pixel portion, the value of the pixel signal output from the phase difference pixel PL becomes small, and the value of the pixel signal output from the phase difference pixel PR becomes large.

It should be noted that when light whose direction from the upper left to the lower right becomes dominant is entering the pixel portion, the value of the pixel signal output from the phase difference pixel PL becomes large, and the value of the pixel signal output from the phase difference pixel PR becomes small in contradiction to the example above.

In other words, in the case of the example shown in FIG. 6, while the phase difference pixel PR has a high light reception sensitivity with respect to light that enters from the upper right, it has a low light reception sensitivity with respect to light that enters from the upper left. In contrast, while the phase difference pixel PL has a high light reception sensitivity with respect to light that enters from the upper left, it has a low light reception sensitivity with respect to light that enters from the upper right. This is because the crosstalk amounts caused by incident light entering adjacent pixels, an incorporation of a pixel signal from adjacent pixels, and the like at a time light that has entered from the same direction is received differ for the phase difference pixel PL and the phase difference pixel PR.

Moreover, as shown in FIG. 5, since the DTI is provided between the phase difference pixel PA and the pixel PC and also between the phase difference pixel PB and the pixel PC, the phase difference pixel PA and the phase difference pixel PB also have different light reception sensitivities.

Also with the structure shown in FIG. 6, a phase difference signal can be obtained without providing a light shield film. In other words, since the light shield film is not provided in the phase difference pixels, the value of the pixel signal output from the phase difference pixels does not become extremely smaller than that of the pixel signal output from normal pixels. Therefore, in the present disclosure, there is no need to handle the phase difference pixels as defective pixels and carry out the defect correction processing.

Further, according to the present disclosure, there is also no need to carry out the crosstalk correction processing for removing crosstalk components due to entering of light reflected by the light shield film.

Figure 7:
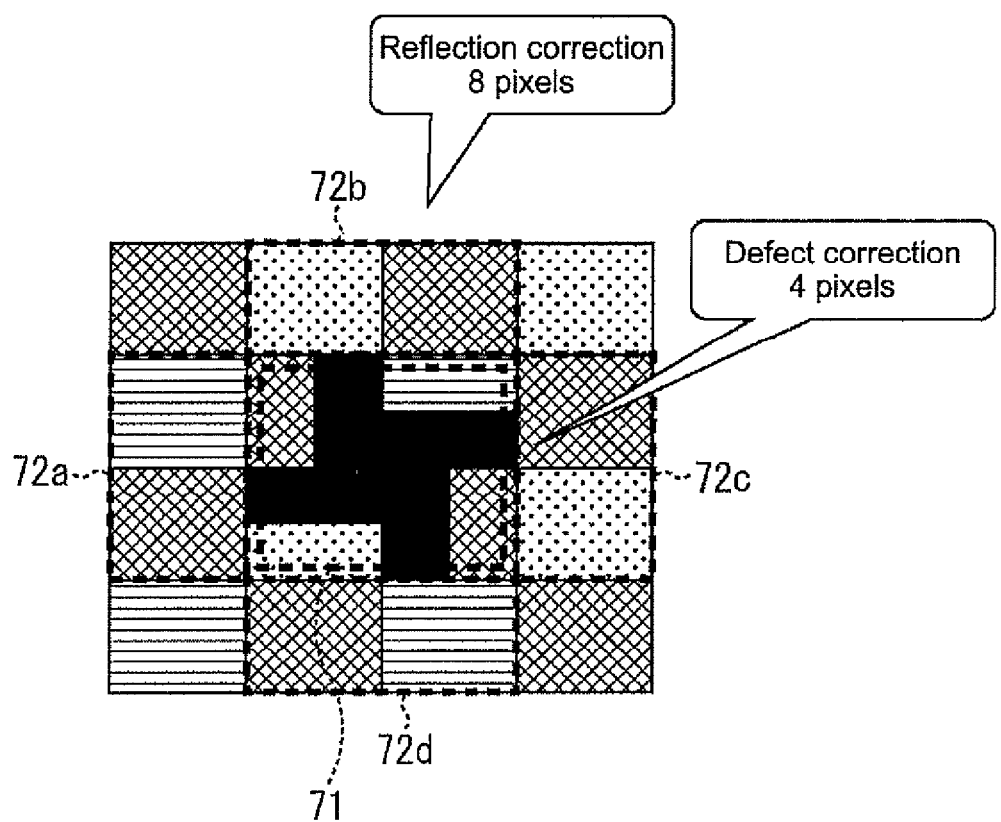
FIG. 7 is a diagram showing an example of the pixel portion of the image sensor in a case of obtaining a phase difference signal by a method of the related art.

FIG. 7 is a diagram showing an example of the pixel portion of the image sensor in the case of obtaining a phase difference signal by a method of the related art. As shown in the figure, in the pixel portion of the image sensor, a plurality of pixels illustrated as rectangles in the figure are arranged in a 2D matrix.

The example of FIG. 7 shows 4 phase difference pixels in which half of the opening portion is optically shielded (blackened in figure). In other words, the 4 pixel surrounded by a rectangular dotted line 71 in FIG. 7 are the phase difference pixels. Of those, a phase difference signal in the horizontal direction is obtained by the two phase difference pixels, and a phase difference signal in the vertical direction is obtained by the other two phase difference pixels.

In the case of FIG. 7, since half of the opening portion of the phase difference pixels is optically shielded, the value of the pixel signal output from the phase difference pixels becomes extremely smaller than that of the pixel signal output from normal pixels even with respect to the pixel signals corresponding to the same light reception amount. Therefore, in the case of FIG. 7, the phase difference pixels are handled as defective pixels, and there is a need to carry out the defect correction processing of predictively generating a pixel signal of the phase difference pixels based on a pixel signal of the pixels adjacent to the phase difference pixels, for example. In this example, the defect correction processing needs to be carried out for the pixel signals corresponding to the 4 phase difference pixels surrounded by the rectangular dotted line 71.

Further, when the light shield film is provided as shown in FIG. 7, light is reflected by the light shield film, and the reflected light enters the peripheral pixels.

Therefore, in the case of FIG. 7, for example, there is a need to carry out the crosstalk correction processing for removing crosstalk components due to entering of light reflected by the light shield film regarding the pixel signal output from the pixels adjacent to the phase difference pixels. In this example, the crosstalk correction processing needs to be carried out for the pixel signals corresponding to the two pixels adjacent to the phase difference pixels on the left-hand side of the figure, that are surrounded by a rectangular dotted line 72*a*. Moreover, the crosstalk correction processing needs to be carried out for the pixel signals corresponding to the two pixels adjacent to the phase difference pixels on the right-hand side of the figure, that are surrounded by a rectangular dotted line 72*c*. Similarly, the crosstalk correction processing needs to be carried out for the pixel signals corresponding to the two pixels adjacent to the phase difference pixels on the upper side of the figure, that are surrounded by a rectangular dotted line 72*b* and two pixels adjacent to the phase difference pixels on the lower side of the figure, that are surrounded by a rectangular dotted line 72*d*.

Specifically, when obtaining a phase difference signal by the method of the related art, it has been necessary to carry out the defect correction processing for the pixel signals of the 4 pixels and the crosstalk correction processing for the pixel signals of the 8 pixels.

In contrast, according to the present disclosure, the crosstalk correction processing only needs to be carried out for the 5 pixels including the phase difference pixel PL, the phase difference pixel PR, the phase difference pixel PA, the phase difference pixel PB, and the pixel PC shown in FIG. 2, for example.

As described above, according to the present disclosure, it is possible to avoid the pixel signal correction as much as possible and appropriately execute the image plane phase difference AF.

In the examples described above with reference to FIGS. 2 to 6, by not arranging the DTI exceptionally or arranging it exceptionally between the phase difference pixels and the adjacent pixels in the pixel portion of the image sensor, the phase difference pixels have different crosstalk amounts.

However, it is also possible to provide different crosstalk amounts to the phase difference pixels by adjusting an ion implantation amount in forming an electronic barrier with respect to the pixels adjacent to the phase difference pixels in the pixel portion of the image sensor. The electronic barrier may be considered as one of crosstalk suppression mechanisms for suppressing entering of charge electrons among the adjacent sensor areas.

Figure 8:
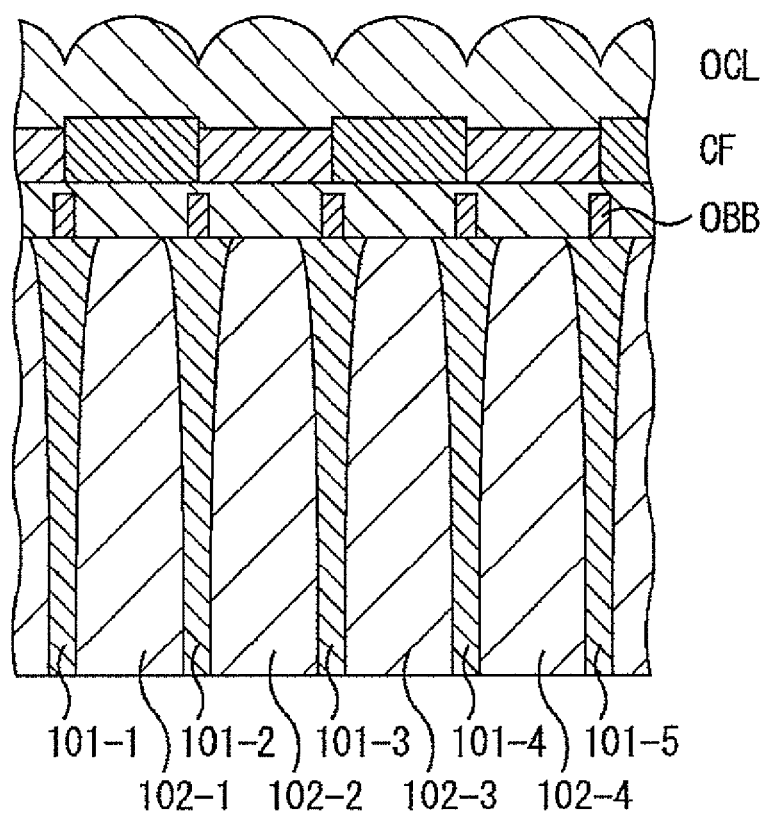
FIG. 8 is a diagram showing another example of the cross-sectional diagram of the pixel portion of the image sensor to which the present disclosure is applied.

FIG. 8 is a diagram showing an example of the cross-sectional diagram of the pixel portion of the image sensor to which the present disclosure is applied. As shown in the figure, each pixel includes sensor areas 102-1 to 102-4 for photoelectrically converting received light. Moreover, the sensor areas of each pixel are separated from one another by electronic barriers 101-1 to 101-5.

For example, when the ion implantation amount in forming the electronic barriers is small, entering of charges (electrons) from adjacent sensor areas is apt to occur, and thus crosstalk is apt to occur. In FIG. 8, for example, when the ion implantation amount in forming the electronic barrier 101-4 is small, entering of charges (electrons) with respect to the sensor area 102-4 when receiving light traveling from the upper left to the lower right is apt to occur. Moreover, for example, when the ion implantation amount in forming the electronic barrier 101-3 is small, entering of charges (electrons) with respect to the sensor area 102-2 when receiving light traveling from the upper right to the lower left is apt to occur.

In this case, for example, the pixel corresponding to the sensor area 102-2 and the pixel corresponding to the sensor area 102-4 can be used as the phase difference pixels for obtaining a phase difference signal in the horizontal direction.

As described above, by adjusting the ion implantation amount in forming the electronic barriers with respect to the pixels adjacent to the phase difference pixels in the pixel portion of the image sensor, the crosstalk amounts of the phase difference pixels in receiving light that has entered from the same direction can be differentiated. Therefore, also in this case, as in the case described above with reference to FIGS. 2 to 6, it is possible to avoid the pixel signal correction as much as possible and appropriately execute the image plane phase difference AF.

Further, for example, by adjusting the ion implantation amount in forming the sensor areas in the pixel portion of the image sensor, the phase difference pixels can be structured to have different crosstalk amounts as in the case described above.

For example, when the ion implantation amount in forming the sensor areas is small, entering of charges (electrons) with respect to adjacent sensor areas is apt to occur, and thus crosstalk is apt to occur. In FIG. 8, for example, when the ion implantation amount in forming the sensor area 102-3 is small, entering of charges (electrons) with respect to the sensor area 102-4 when receiving light traveling from the upper left to the lower right is apt to occur, and entering of charges (electrons) with respect to the sensor area 102-2 when receiving light traveling from the upper right to the lower left is apt to occur.

In this case, for example, the pixel corresponding to the sensor area 102-2 and the pixel corresponding to the sensor area 102-4 can be used as the phase difference pixels for obtaining a phase difference signal in the horizontal direction.

As described above, by adjusting the ion implantation amount in forming the sensor areas in the pixel portion of the image sensor, the crosstalk amounts of the phase difference pixels in receiving light that has entered from the same direction can be differentiated. Therefore, also in this case, as in the case described above with reference to FIGS. 2 to 6, it is possible to avoid the pixel signal correction as much as possible and appropriately execute the image plane phase difference AF.

Alternatively, by using a white CF as the CF of the pixels adjacent to the phase difference pixels, the phase difference pixels can be structured to have different crosstalk amounts.

Figure 9:
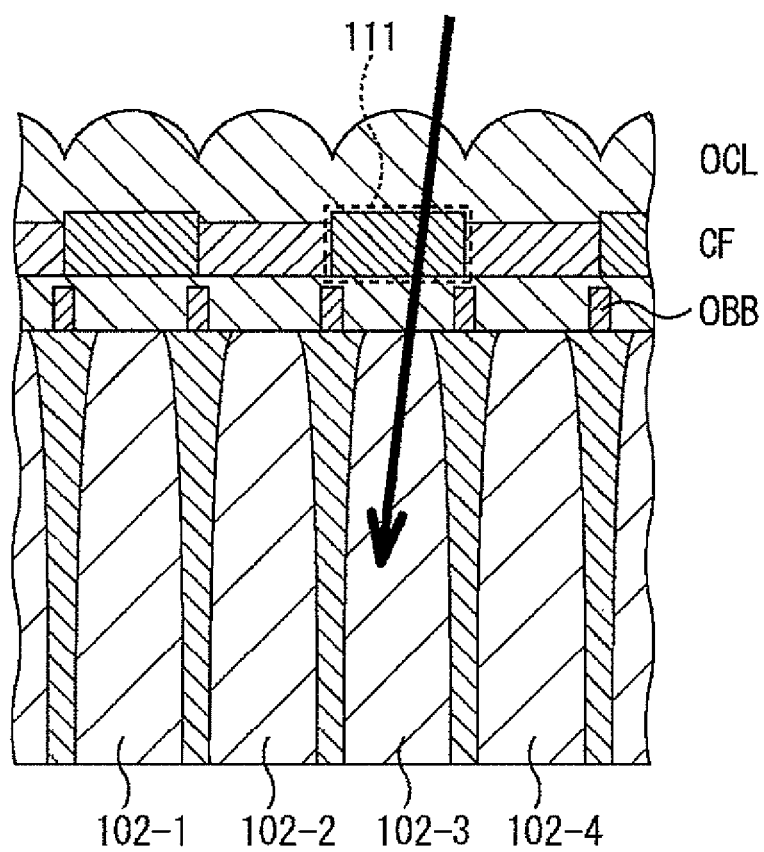
FIG. 9 is a diagram showing another example of the cross-sectional diagram of the pixel portion of the image sensor to which the present disclosure is applied.

FIG. 9 is a diagram showing another example of the cross-sectional diagram of the pixel portion of the image sensor to which the present disclosure is applied. As shown in the figure, each pixel includes the sensor areas 102-1 to 102-4 for photoelectrically converting received light. In the example of FIG. 9, a CF 111 of the pixel corresponding to the sensor area 102-3 is the white CF. Since the white CF is a CF having high optical transparency, optical components that have passed through the CF 111 are apt to enter the sensor area adjacent to the sensor area 102-3.

In the case of FIG. 9, entering of light with respect to the sensor area 102-4 in receiving light traveling from the upper left to the lower right is apt to occur, and entering of charges (electrons) with respect to the sensor area 102-2 in receiving light traveling from the upper right to the lower left is apt to occur.

In this case, for example, the pixel corresponding to the sensor area 102-2 and the pixel corresponding to the sensor area 102-4 can be used as the phase difference pixels for obtaining a phase difference signal in the horizontal direction.

As described above, by using the white CF as the CF of the pixels adjacent to the phase difference pixels in the pixel portion of the image sensor, the crosstalk amounts of the phase difference pixels in receiving light that has entered from the same direction can be differentiated.

Alternatively, for example, it is also possible to structure the phase difference pixels to have different crosstalk amounts by removing an OBB between the pixels adjacent to the phase difference pixels in the pixel portion of the image sensor.

Figure 10:
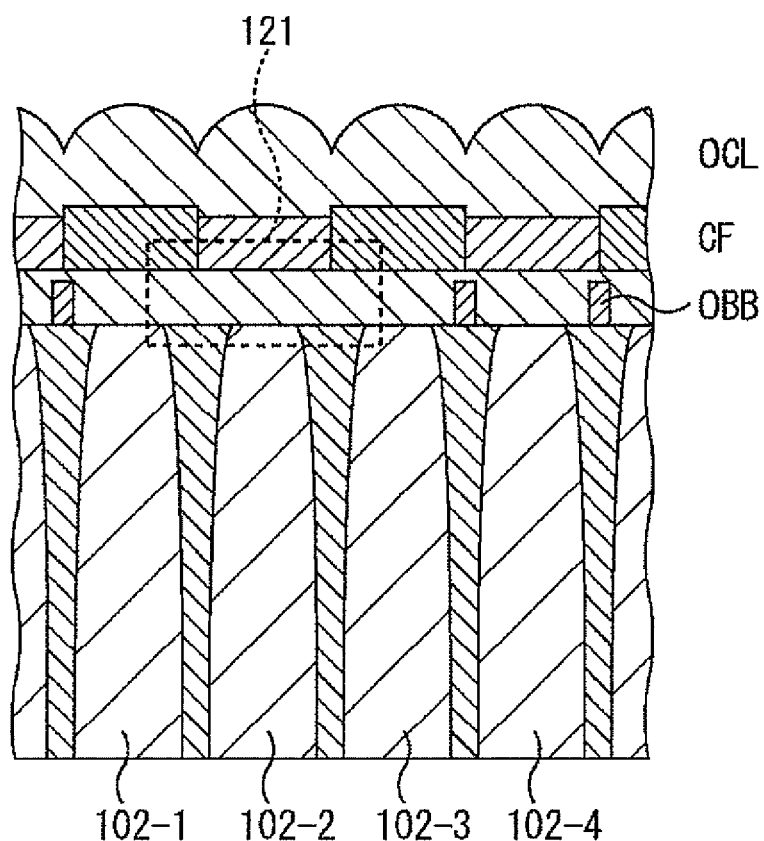
FIG. 10 is a diagram showing another example of the cross-sectional diagram of the pixel portion of the image sensor to which the present disclosure is applied.

FIG. 10 is a diagram showing another example of the cross-sectional diagram of the pixel portion of the image sensor to which the present disclosure is applied. As shown in the figure, each pixel includes the sensor areas 102-1 to 102-4 for photoelectrically converting received light. In the example of FIG. 10, the OBB between the pixel corresponding to the sensor area 102-2 and the pixel corresponding to the sensor area 102-1 and the OBB between the pixel corresponding to the sensor area 102-2 and the pixel corresponding to the sensor area 102-3 are removed.

With the structure as shown in FIG. 10, entering of light with respect to the sensor area 102-3 in receiving light traveling from the upper left to the lower right is apt to occur, and entering of light with respect to the sensor area 102-1 in receiving light traveling from the upper right to the lower left is apt to occur.

In this case, for example, the pixel corresponding to the sensor area 102-1 and the pixel corresponding to the sensor area 102-3 can be used as the phase difference pixels for obtaining a phase difference signal in the horizontal direction.

As described above, by removing the OBBs between the pixels adjacent to the phase difference pixels in the pixel portion of the image sensor, the crosstalk amounts of the phase difference pixels in receiving light that has entered from the same direction can be differentiated.

Alternatively, for example, when a waveguide from the CF to the sensor area is provided in the pixel portion of the image sensor, by removing the waveguide of the pixels adjacent to the phase difference pixels, the phase difference pixels can be structured to have different crosstalk amounts.

Figure 11:
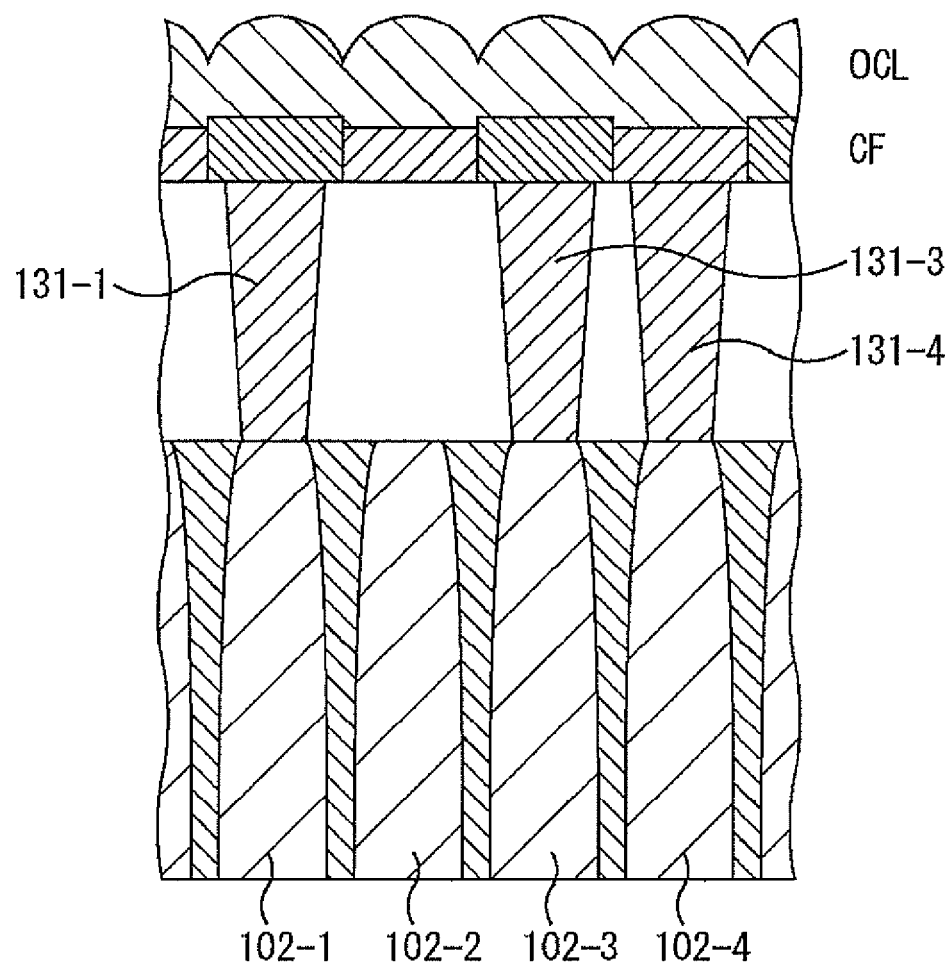
FIG. 11 is a diagram showing another example of the cross-sectional diagram of the pixel portion of the image sensor to which the present disclosure is applied.

FIG. 11 is a diagram showing another example of the cross-sectional diagram of the pixel portion of the image sensor to which the present disclosure is applied. As shown in the figure, each pixel includes the sensor areas 102-1 to 102-4 for photoelectrically converting received light. In the example of FIG. 11, a waveguide 131-1 is provided to the pixel corresponding to the sensor area 102-1, and waveguides 131-3 and 131-4 are respectively provided to the pixels corresponding to the sensor areas 102-3 and 102-4. However, a waveguide is not provided to the pixel corresponding to the sensor area 102-2.

With the structure as shown in FIG. 11, entering of light with respect to the sensor area 102-3 in receiving light traveling from the upper left to the lower right is apt to occur, and entering of charges (electrons) with respect to the sensor area 102-1 in receiving light traveling from the upper right to the lower left is apt to occur.

In this case, for example, the pixel corresponding to the sensor area 102-1 and the pixel corresponding to the sensor area 102-3 can be used as the phase difference pixels for obtaining a phase difference signal in the horizontal direction.

As described above, by removing the waveguides between the pixels adjacent to the phase difference pixels when the waveguide from the CF to the sensor area is provided in the pixel portion of the image sensor, the crosstalk amounts of the phase difference pixels in receiving light that has entered from the same direction can be differentiated.

Alternatively, for example, by adjusting a light collection property of the OCL of the pixels adjacent to the phase difference pixels in the pixel portion of the image sensor, the phase difference pixels can be structured to have different crosstalk amounts.

Figure 12:
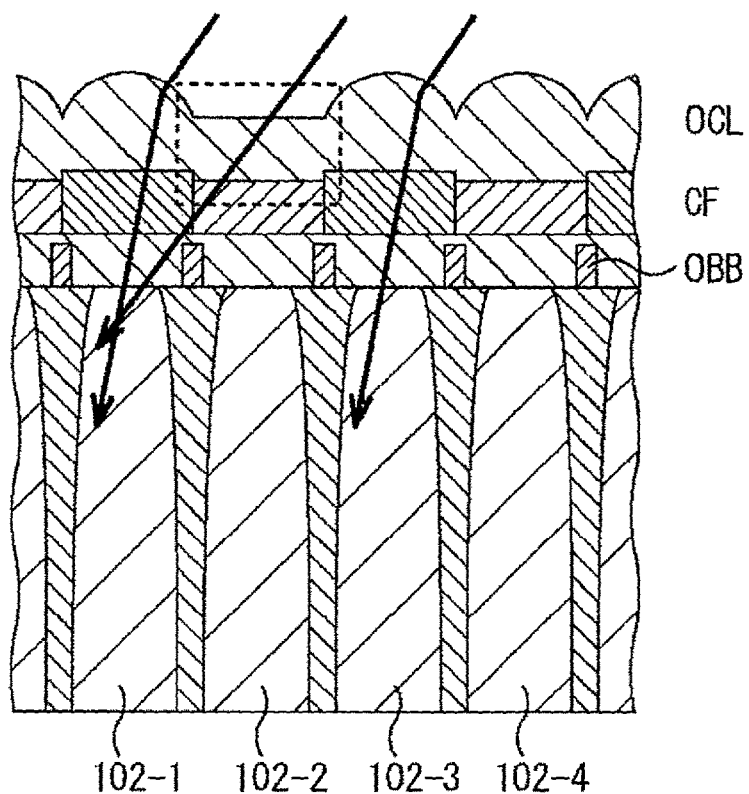
FIG. 12 is a diagram showing another example of the cross-sectional diagram of the pixel portion of the image sensor to which the present disclosure is applied.

FIG. 12 is a diagram showing another example of the cross-sectional diagram of the pixel portion of the image sensor to which the present disclosure is applied. As shown in the figure, each pixel includes the sensor areas 102-1 to 102-4 for photoelectrically converting received light. In the example of FIG. 12, the shape of the OCL of the pixel corresponding to the sensor area 102-2 is plane, and thus the light collection property is low.

With the structure as shown in FIG. 12, entering of light with respect to the sensor area 102-3 in receiving light traveling from the upper left to the lower right is apt to occur, and entering of charges (electrons) with respect to the sensor area 102-1 in receiving light traveling from the upper right to the lower left is apt to occur.

In this case, for example, the pixel corresponding to the sensor area 102-1 and the pixel corresponding to the sensor area 102-3 can be used as the phase difference pixels for obtaining a phase difference signal in the horizontal direction.

Further, the embodiments above may be used in combination. For example, the structures of the OCL, CF, and OBB can be used as the embodiment above with reference to FIGS. 9 to 12 together with the arrangement of the DTI shown in FIG. 2. Moreover, for example, the structures of the OCL, CF, and OBB can be used as the embodiment above with reference to FIGS. 9 to 12 together with the arrangement of the DTI shown in FIG. 5. Furthermore, the structures of the OCL, CF, and OBB can be used as the embodiment above with reference to FIGS. 9 to 12 together with the adjustment of the ion implantation amount as described above with reference to FIG. 8.

Heretofore, the example of obtaining a phase difference signal without optically shielding the opening portion of the phase difference pixels has been descried. However, the opening portion of the phase difference pixels may be optically shielded so as to enable the change of the crosstalk amounts of the phase difference pixels to be detected more accurately.

Figure 13:
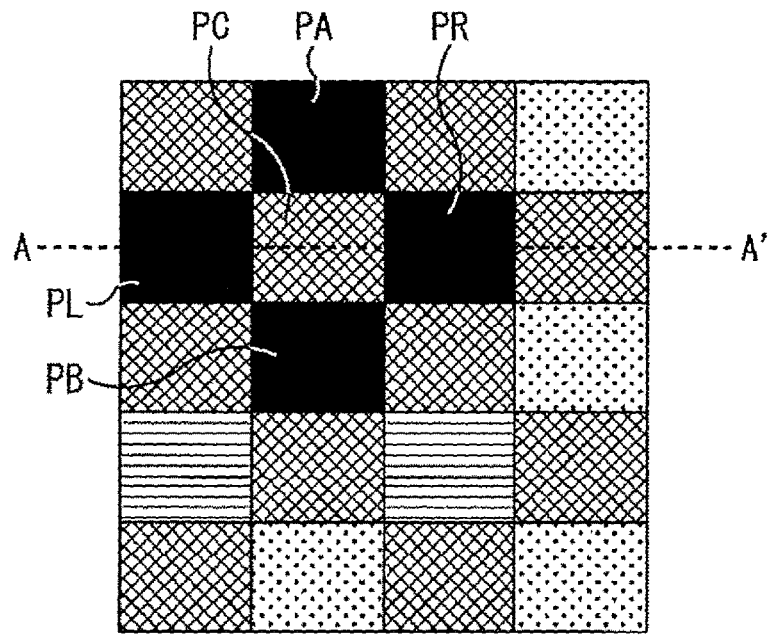
FIG. 13 is a diagram showing another structural example of the pixel portion of the image sensor to which the present disclosure is applied.

FIG. 13 is a diagram showing another structural example of the pixel portion of the image sensor to which the present disclosure is applied. As shown in the figure, in the pixel portion of the image sensor, a plurality of pixels illustrated as rectangles in the figure are arranged in a 2D matrix. Such a pixel portion is structured as a pixel array of the image sensor. Here, a part of the pixels arranged in the effective area of the pixel array are shown.

In this example, the pixels PL, PR, PA, and PB are the phase difference pixels. In other words, a lateral phase difference signal is obtained by the phase difference pixel PL and the phase difference pixel PR, and a longitudinal phase difference signal is obtained by the phase difference pixel PA and the phase difference pixel PB.

Further, in the example of FIG. 13, the DTI is not arranged on 4 sides of the rectangular pixel in principle, and the DTI is arranged exceptionally on 4 sides of the pixel PC arranged at the center of the 4 phase difference pixels as in the case described above with reference to FIG. 5. However, in the example of FIG. 13, the opening portion of the 4 phase difference pixels is optically shielded (blackened in figure) unlike the case described above with reference to FIG. 5.

Figure 14:
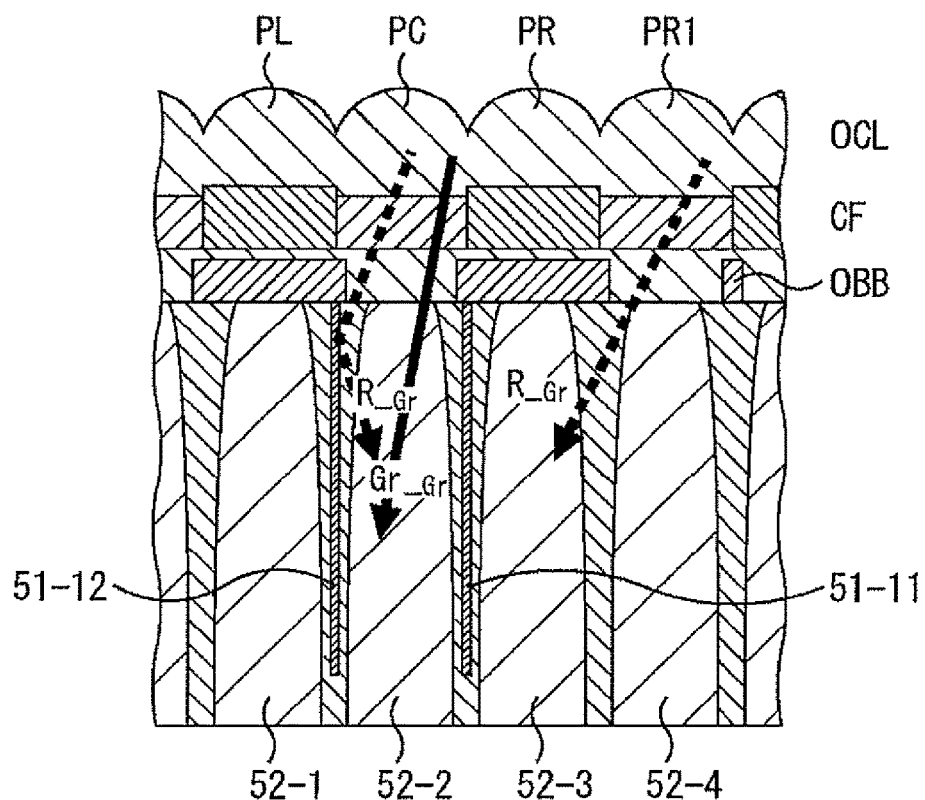
FIG. 14 is a cross-sectional diagram of the pixel portion of the image sensor shown in FIG. 13 taken along the line A-A'.

FIG. 14 is a cross-sectional diagram taken along the line A-A' of FIG. 13 for explaining a difference in the crosstalk amounts of the phase difference pixels shown in FIG. 13.

In the case of FIG. 13, the Bayer arrangement is adopted for the pixel portion as in the case of FIG. 6, and the pixels respectively correspond to the color components of red (R), green (Gr), and blue (B). For example, a red CF is arranged in the phase difference pixel PL, a green CF is arranged in the pixel PC, a red CF is arranged in the phase difference pixel PR, and a green CF is arranged in the pixel PR1.

It is assumed that light whose direction from the upper right to the lower left becomes dominant in FIG. 14 is entering the pixel portion.

In the case of the example shown in FIG. 14, although the optical component $R_{-Gr}$ to be incorporated from the pixel PR1 on the immediate right, that corresponds to the green color component, enters the sensor area 52-3 of the phase difference pixel PR corresponding to the red color component, since the opening portion is optically shielded, the optical component $R_{-R}$ to be absorbed by the sensor area of the pixel itself does not enter.

Further, in the case of the example shown in FIG. 14, regarding the pixel PC corresponding to the green color component, the optical component $Gr_{-Gr}$ to be absorbed by the sensor area 52-2 of the pixel itself and the optical component $R_{-Gr}$ to be incorporated into the sensor area of the phase difference pixel PL on the immediate left, that corresponds to the red color component, enter that pixel. However, the component $R_{-Gr}$ is suppressed from entering by the DTI 51-12 and is thus absorbed by the sensor area 52-2 of the pixel itself.

Furthermore, in the case of the example shown in FIG. 14, regarding the phase difference pixel PL corresponding to the red color component, the optical component $R_{-R}$ to be absorbed by the sensor area of the pixel itself does not enter since the opening portion is optically shielded. Moreover, since the DTI is provided between the phase difference pixel PL and the pixel PC, the component $Gr_{-R}$ also does not enter the sensor area 52-1.

As a result, in the sensor area 52-1 of the phase difference pixel PL, a photoelectric conversion is hardly performed, and the component $R_{-Gr}$ that has been incorporated from the pixel PR1 is absorbed by the sensor area 52-3 of the phase difference pixel PR to be photoelectrically converted. Consequently, when light whose direction from the upper right to the lower left becomes dominant is entering the pixel portion, the value of the pixel signal output from the phase difference pixel PL becomes small, and the value of the pixel signal output from the phase difference pixel PR becomes large. In this case, the pixel signals of the phase difference pixel PL and the phase difference pixel PR are obtained mostly by crosstalk.

As described above, the opening portion of the phase difference pixels may be optically shielded for enabling the change of the crosstalk amounts of the phase difference pixels to be detected more accurately.

Alternatively, as in the case described above with reference to FIG. 2, it is also possible to arrange the DTI on 4 sides of the rectangular pixel in principle, not arrange the DTI exceptionally on 4 sides of the pixel PC arranged at the center of the 4 phase difference pixels, and optically shield the opening portion of the 4 phase difference pixels.

In this case, it is effective to use a white CF for the CF of the pixel PC arranged at the center of the 4 phase difference pixels.

Figure 15:
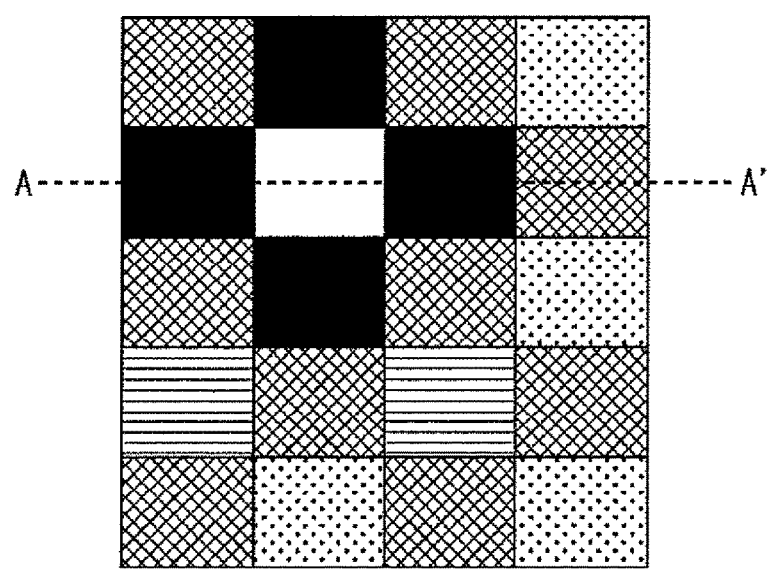
FIG. 15 is a diagram showing another structural example of the pixel portion of the image sensor to which the present disclosure is applied.

FIG. 15 is a diagram showing another structural example of the pixel portion of the image sensor to which the present disclosure is applied. As shown in the figure, in the pixel portion of the image sensor, a plurality of pixels illustrated as rectangles in the figure are arranged in a 2D matrix. Such a pixel portion is structured as a pixel array of the image sensor. Here, a part of the pixels arranged in the effective area of the pixel array are shown.

In this example, the pixels PL, PR, PA, and PB are the phase difference pixels. In other words, a lateral phase difference signal is obtained by the phase difference pixel PL and the phase difference pixel PR, and a longitudinal phase difference signal is obtained by the phase difference pixel PA and the phase difference pixel PB.

Further, in the example of FIG. 15, the DTI is arranged on 4 sides of the rectangular pixel in principle, and the DTI is not arranged exceptionally on 4 sides of the pixel PC arranged at the center of the 4 phase difference pixels as in the case described above with reference to FIG. 2. However, in the example of FIG. 15, the opening portion of the 4 phase difference pixels is optically shielded (blackened in figure) unlike the case described above with reference to FIG. 2.

Figure 16:
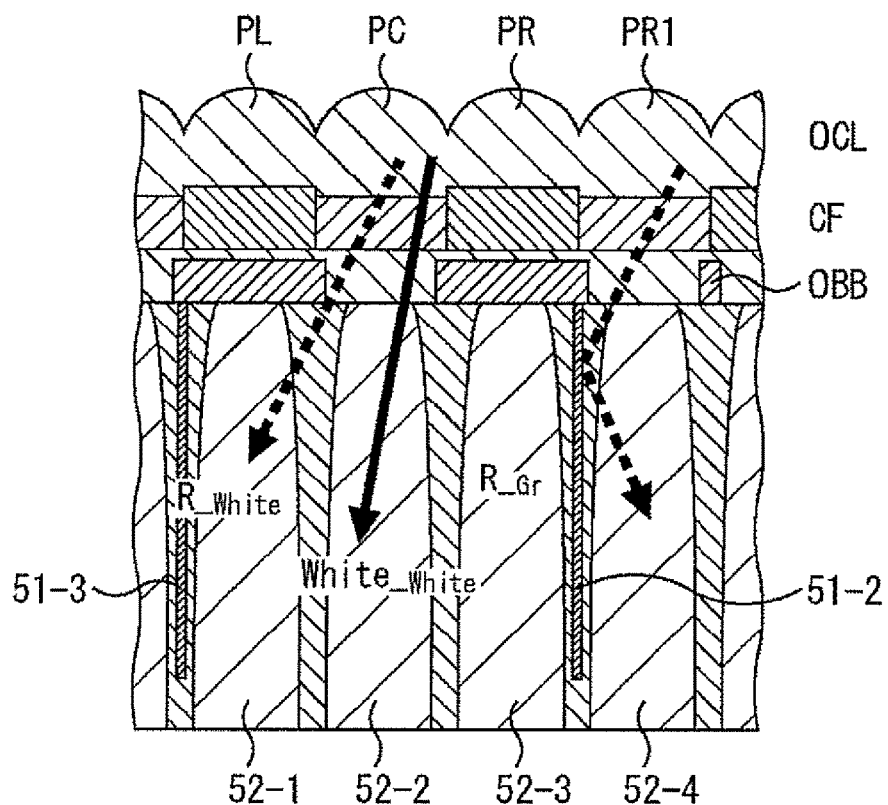
FIG. 16 is a cross-sectional diagram of the pixel portion of the image sensor shown in FIG. 15 taken along the line A-A'.

FIG. 16 is a cross-sectional diagram taken along the line A-A' of FIG. 15 for explaining a difference in the crosstalk amounts of the phase difference pixels shown in FIG. 15.

In the case of FIG. 16, for example, a red CF is arranged in the phase difference pixel PL, a white CF is arranged in the pixel PC, a red CF is arranged in the phase difference pixel PR, and a green CF is arranged in the pixel PR1.

It is assumed that light whose direction from the upper right to the lower left becomes dominant in FIG. 16 is entering the pixel portion.

In the case of the example shown in FIG. 16, since the DTI 51-2 is provided between the phase difference pixel PR corresponding to the red color component and the pixel PR1 on the immediate right, that corresponds to the green color component, the optical component $R_{-Gr}$ does not enter the sensor area 52-3. In addition, since the opening portion is optically shielded, the optical component $R_{-R}$ to be absorbed by the sensor area of the pixel itself also does not enter.

Further, in the case of the example shown in FIG. 16, regarding the pixel PC corresponding to the white color component, an optical component $White_{-White}$ to be absorbed by the sensor area 52-2 of the pixel itself and an optical component $R_{-White}$ to be incorporated into the sensor area of the pixel on the immediate left, that corresponds to the red color component, enter that pixel. In this case, since the DTI is not provided between the pixel PC and the phase difference pixel PL, the optical component $R_{-White}$ enters the sensor area 52-1 as it is.

Furthermore, in the case of the example shown in FIG. 16, since the opening portion of the phase difference pixel PL corresponding to the red color component is optically shielded, the optical component $R_{-R}$ to be absorbed by the sensor area of the pixel itself does not enter that pixel.

As a result, in the sensor area 52-3 of the phase difference pixel PR, a photoelectric conversion is hardly performed, and the component $R_{-White}$ that has been incorporated from the pixel PC is absorbed by the sensor area 52-1 of the phase difference pixel PL to be photoelectrically converted. Consequently, when light whose direction from the upper right to the lower left becomes dominant is entering the pixel portion, the value of the pixel signal output from the phase difference pixel PR becomes small, and the value of the pixel signal output from the phase difference pixel PL becomes large. In this case, the pixel signals of the phase difference pixel PL and the phase difference pixel PR are obtained mostly by crosstalk, but since the white CF has high optical transparency, a difference between the values of the pixel signals output from the two phase difference pixels becomes more prominent.

With such a structure, it becomes possible to detect a change in the crosstalk amounts of the phase difference pixels more accurately, for example.

Alternatively, an arrangement different from the Bayer arrangement may be used for the CFs of the phase difference pixels. For example, CFs of the same color may be used as the CFs of the 4 phase difference pixels. For example, a green CF that has the highest optical transparency out of red (R), green (Gr), and blue (B) may be used as the CFs of the 4 phase difference pixels.

Figure 17:
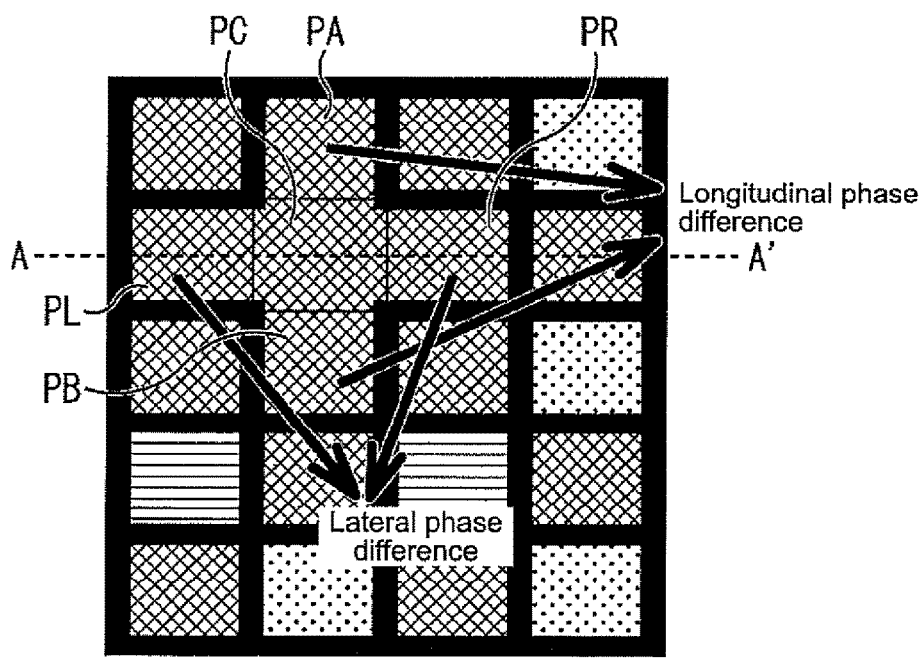
FIG. 17 is a diagram showing another structural example of the pixel portion of the image sensor to which the present disclosure is applied.

FIG. 17 is a diagram showing another structural example of the pixel portion of the image sensor to which the present disclosure is applied. As shown in the figure, in the pixel portion of the image sensor, a plurality of pixels illustrated as rectangles in the figure are arranged in a 2D matrix.

In this example, the pixels PL, PR, PA, and PB are the phase difference pixels. In other words, a lateral phase difference signal is obtained by the phase difference pixel PL and the phase difference pixel PR, and a longitudinal phase difference signal is obtained by the phase difference pixel PA and the phase difference pixel PB.

Further, in the example of FIG. 17, the DTI is arranged on 4 sides of the rectangular pixel in principle, and the DTI is not arranged exceptionally on 4 sides of the pixel PC arranged at the center of the 4 phase difference pixels as in the case described above with reference to FIG. 2. However, in the example of FIG. 17, the CFs of the 4 phase difference pixels are all green CFs unlike the case described above with reference to FIG. 2.

By structuring the pixel portion of the image sensor as shown in FIG. 17, the pixel signals output from the phase difference pixels constantly take relatively-large values.

Heretofore, the example in which the 4 phase difference pixels PL, PR, PA, and PB are arranged so as to surround the center pixel PC has been described. However, when such a structure is adopted, there is a need to carry out the crosstalk correction processing for the 5 pixels as described above. In other words, the crosstalk correction processing needs to be carried out also for the pixel PC that is not the phase difference pixel.

Figure 18:
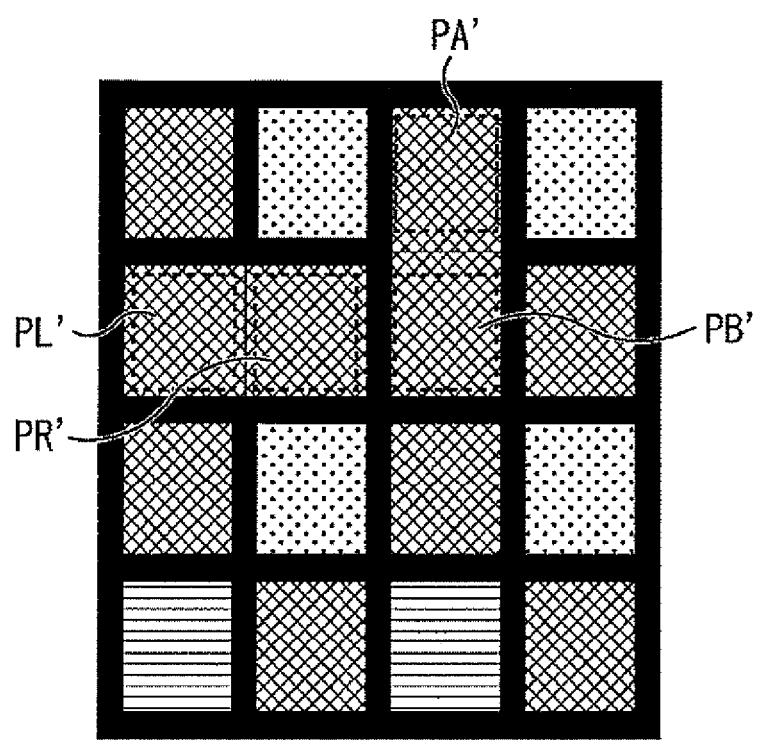
FIG. 18 is a diagram showing another structural example of the pixel portion of the image sensor to which the present disclosure is applied.

For example, a structure as shown in FIG. 18 may be adopted for reducing the number of pixels to be the target of the crosstalk correction processing.

FIG. 18 is a diagram showing another structural example of the pixel portion of the image sensor to which the present disclosure is applied. As shown in the figure, in the pixel portion of the image sensor, a plurality of pixels illustrated as rectangles in the figure are arranged in a 2D matrix. Such a pixel portion is structured as a pixel array of the image sensor. Here, a part of the pixels arranged in the effective area of the pixel array are shown.

In this example, pixels PL', PR', PA', and PB' are the phase difference pixels. In other words, a lateral phase difference signal is obtained by the phase difference pixel PL' and the phase difference pixel PR', and a longitudinal phase difference signal is obtained by the phase difference pixel PA' and the phase difference pixel PB'.

Further, in the case of the structure shown in FIG. 18, while the DTI is arranged on 4 sides of the rectangular pixel in principle, the DTI is not arranged exceptionally between the phase difference pixel PL' and the phase difference pixel PR' and between the phase difference pixel PA' and the phase difference pixel PB'.

With such as structure, when light whose direction from the upper right to the lower left becomes dominant is entering the pixel portion, the value of the pixel signal output from the phase difference pixel PR' becomes small, and the value of the pixel signal output from the phase difference pixel PL' becomes large. This is because the crosstalk amount with respect to the phase difference pixel PL' becomes large. On the contrary, when light whose direction from the upper left to the lower right becomes dominant is entering the pixel portion, the value of the pixel signal output from the phase difference pixel PL' becomes small, and the value of the pixel signal output from the phase difference pixel PR' becomes large. This is because the crosstalk amount with respect to the phase difference pixel PR' becomes large.

Similarly, in the case of FIG. 18, since the DTI is not provided between the phase difference pixel PA' and the phase difference pixel PB', the light reception sensitivities of the phase difference pixel PA' and the phase difference pixel PB' differ.

Therefore, by adopting the structure shown in FIG. 18, a phase difference signal can be obtained without providing a light shield film. Specifically, since the light shield film is not provided to the phase difference pixels, the value of the pixel signal output from the phase difference pixels does not become extremely smaller than that of the pixel signal output from normal pixels. Therefore, there is no need to handle the phase difference pixels as defective pixels and carry out the defect correction processing.

Moreover, there is also no need to carry out the crosstalk correction processing for removing crosstalk components due to entering of light reflected by the light shield film.

It should be noted that in the case of FIG. 18, it is desirable to arrange the CFs of the same color for the phase difference pixel PL' and the phase difference pixel PR' and the CFs of the same color for the phase difference pixel PA' and the phase difference pixel PB' for obtaining accurate phase difference signals. For example, it is desirable to use a green CF for the CFs of all 4 phase difference pixels.

Furthermore, in the example of FIG. 18, the 4 phase difference pixels are arranged in an L shape and are not arranged so as to surround the center pixel PC as described above with reference to FIG. 2, for example.

Therefore, when adopting the structure shown in FIG. 18, only the 4 phase difference pixels can be targeted for the crosstalk correction processing so that the number of pixels to be targeted for the crosstalk correction processing can be reduced as compared to the case of adopting the structures described above with reference to FIGS. 2, 5, and the like, for example.

Figure 19:
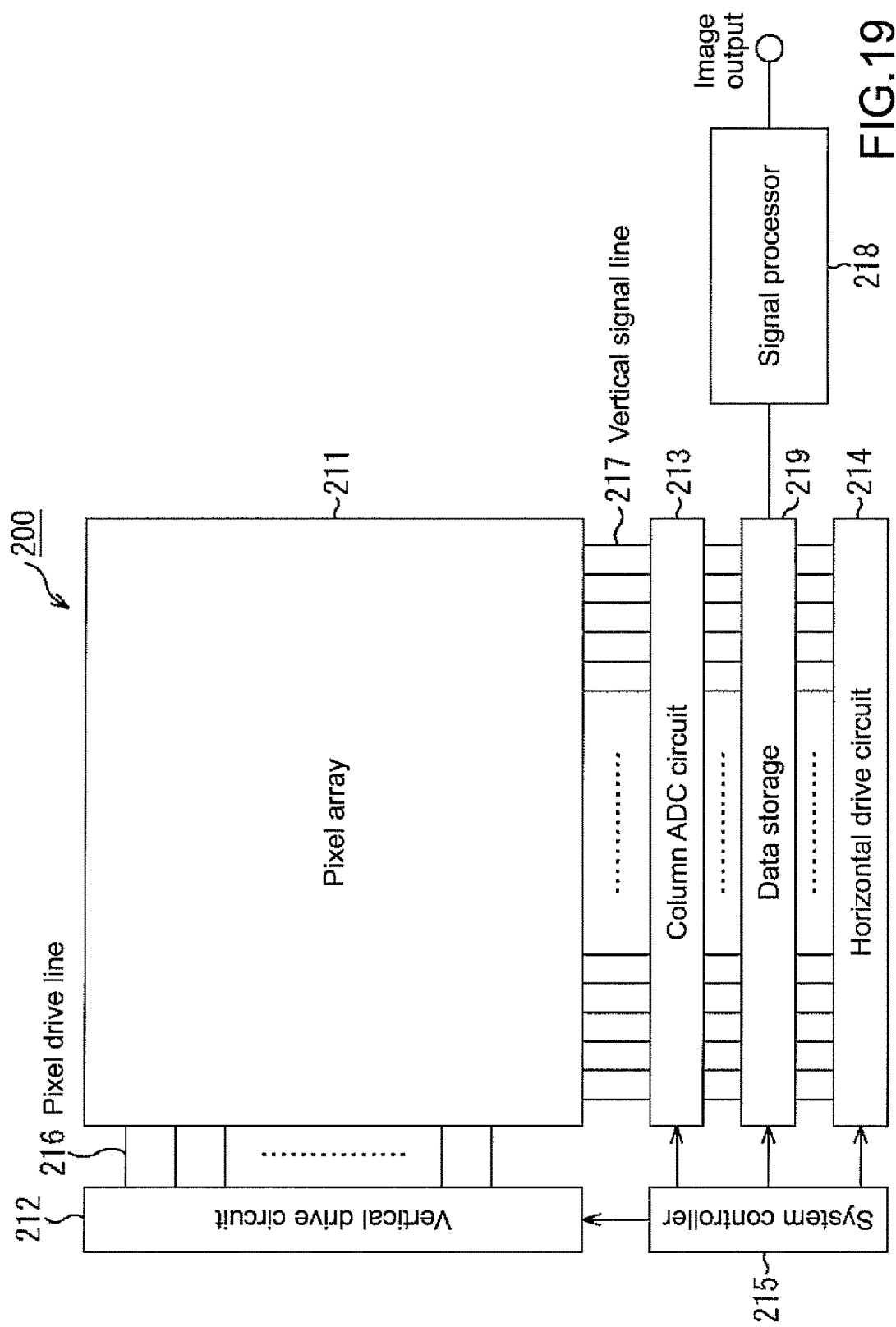
FIG. 19 is a system structural diagram schematically showing a solid-state image pickup apparatus to which the present disclosure is applied.

FIG. 19 is a system structural diagram schematically showing a solid-state image pickup apparatus to which the present disclosure is applied. Here, a system structural diagram schematically showing a structure of a CMOS image sensor 200 to which the present disclosure is applied is shown.

As shown in FIG. 19, the CMOS image sensor 200 includes a pixel array 211 formed on a semiconductor substrate (chip) (not shown) and a peripheral circuit portion integrated on the same semiconductor substrate as the pixel array 211. In this example, the peripheral circuit portion is constituted of a vertical drive circuit 212, a column ADC circuit 213, a horizontal drive circuit 214, and a system controller 215.

The CMOS image sensor 200 also includes a signal processor 218 and a data storage 219. The signal processor 218 and the data storage 219 may be realized by an external signal processor such as a DSP (Digital Signal Processor) provided on a different substrate from the CMOS image sensor 200 or processed by software, or may be mounted on the same substrate as the CMOS image sensor 200.

In the pixel array 211, pixels including a photoelectric conversion device (e.g., photodiode (PD)) are arranged in a 2D matrix. In other words, the pixel array 211 is structured by the pixel portion having the structures of the embodiments described above with reference to FIGS. 2 to 18.

Further, in the pixel array 211, a pixel drive line 216 is formed with respect to the matrix pixel arrangement along the lateral direction of the figure (pixel arrangement direction in pixel row) for each row, and a vertical signal line 217 is formed along the longitudinal direction of the figure (pixel arrangement direction in pixel column) for each column. In FIG. 19, one pixel drive line 216 is shown, but the number is not limited to one. One end of the pixel drive line 216 is connected to an output terminal of the vertical drive circuit 212 corresponding to each row.

The vertical drive circuit 212 is a pixel drive circuit that is constituted of a shift register, an address decoder, and the like and drives the pixels of the pixel array 211 all at the same time, in a row unit, or the like.

Signals output from the unit pixels of the pixel row selectively scanned by the vertical drive circuit 212 are supplied to the column ADC circuit 213 via the vertical signal lines 217. The column ADC circuit 213 carries out, for each pixel column of the pixel array 211, predetermined signal processing on the signals output from the unit pixels of the selected row via the vertical signal lines 217 and temporarily stores the pixel signals subjected to the signal processing.

The horizontal drive circuit 214 is constituted of a shift register, an address decoder, and the like and sequentially selects a unit circuit corresponding to the pixel column of the column ADC circuit 213. By the selective scan of the horizontal drive circuit 214, the pixel signals subjected to the signal processing by the column ADC circuit 213 are output sequentially.

The system controller 215 is constituted of a timing generator that generates various timing signals, and the like and performs drive control of the vertical drive circuit 212, the column ADC circuit 213, the horizontal drive circuit 214, and the like based on the various timing signals generated by the timing generator.

The signal processor 218 carries out various types of signal processing such as addition processing on the pixel signals output from the column ADC circuit 213. Moreover, a logic portion is provided in the signal processor 218, and a signal correction circuit is provided in the logic portion.

The data storage 219 temporarily stores data requisite for the signal processing by the signal processor 218.

Figure 20:
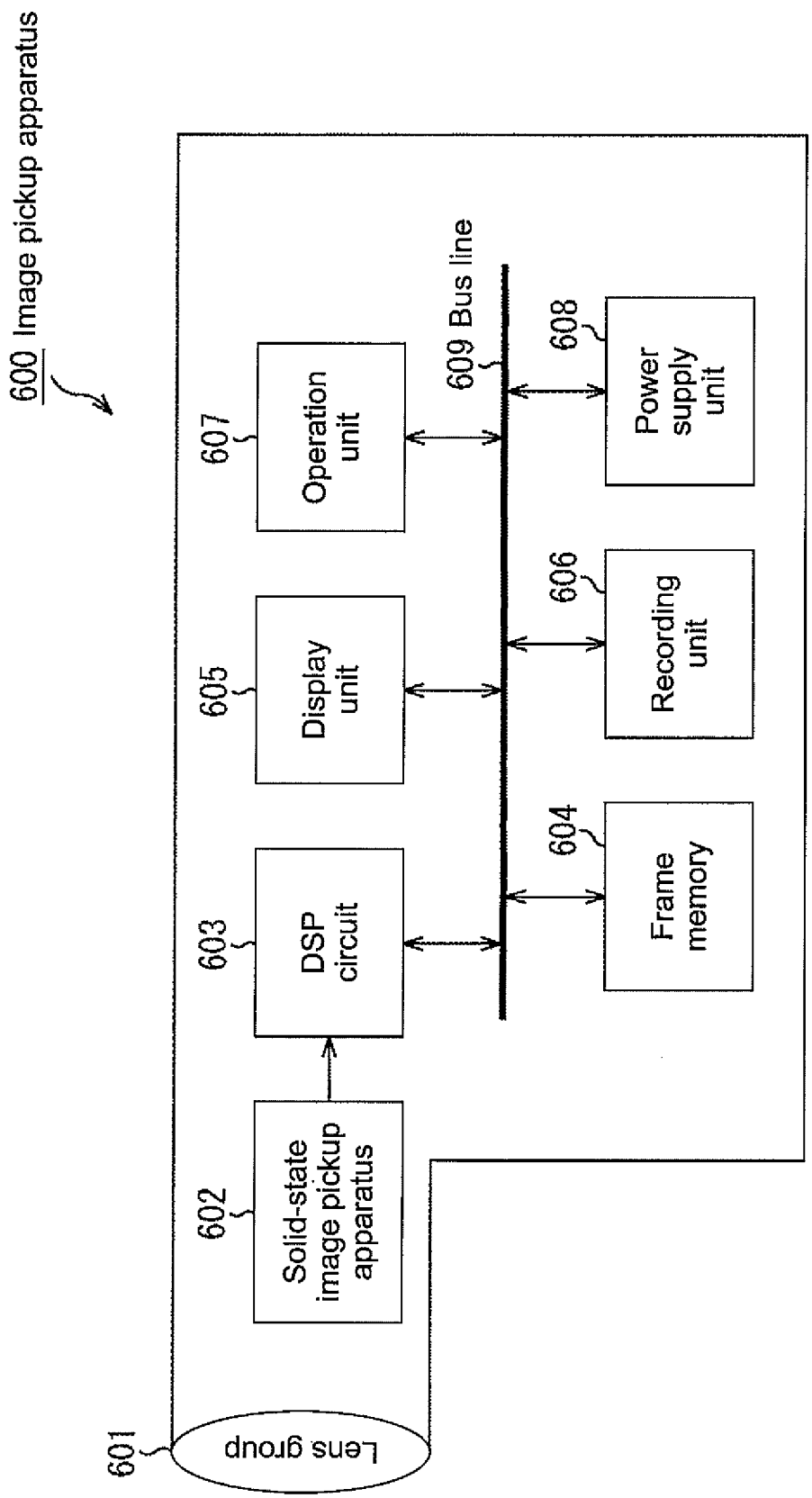
FIG. 20 is a block diagram showing a structural example of the solid-state image pickup apparatus as an electronic apparatus to which the present disclosure is applied.

FIG. 20 is a block diagram showing a structural example of the image pickup apparatus as an electronic apparatus to which the present disclosure is applied.

The image pickup apparatus 600 of FIG. 20 includes an optical unit 601 constituted of a lens group, a solid-state image pickup apparatus (image pickup device) 602, and a DSP circuit 603 as a camera signal processing circuit. The image pickup apparatus 600 also includes a frame memory 604, a display unit 605, a recording unit 606, an operation unit 607, and a power supply unit 608. The DSP circuit 603, the frame memory 604, the display unit 605, the recording unit 606, the operation unit 607, and the power supply unit 608 mutually connected via a bus line 609.

The optical unit 601 takes in incident light from an object (image light) and images it on an image pickup surface of the solid-state image pickup apparatus 602. The solid-state image pickup apparatus 602 converts the light amount of the incident light imaged on the image pickup surface by the optical unit 601 into an electric signal in a pixel unit and outputs it as a pixel signal. As the solid-state image pickup apparatus 602, a solid-state image pickup apparatus such as the CMOS image sensor 200 according to the embodiment above can be used.

The display unit 605 is constituted of a panel-type display apparatus such as a liquid crystal panel and an organic EL (Electro Luminescence) panel and displays a moving image or a still image taken by the solid-state image pickup apparatus 602. The recording unit 606 records the moving image or still image taken by the solid-state image pickup apparatus 602 onto a recording medium such as a video tape and a DVD (Digital Versatile Disc).

The operation unit 607 issues an operation instruction with respect to various functions of the image pickup apparatus 600 based on a user operation. The power supply unit 608 supplies various types of power to be operational power of the DSP circuit 603, the frame memory 604, the display unit 605, the recording unit 606, and the operation unit 607 to those supply targets as appropriate.

Further, the embodiments above have described an example of the case where the present disclosure is applied to a CMOS image sensor in which unit pixels for detecting a signal charge corresponding to a visible light amount as a physical amount are arranged in a matrix. However, the present disclosure is not limited to the CMOS image sensor and is also applicable to general column-type solid-state image pickup apparatuses in which a column processor is arranged for each pixel column in a pixel array.

Moreover, the present disclosure is not limited to the solid-state image pickup apparatus that detects a distribution of an incident light amount of visible light and images it as an image and is also applicable to general solid-state image pickup apparatuses (physical amount distribution detection apparatuses) such as a solid-state image pickup apparatus that images an incident light amount distribution of infrared rays, X rays, particles, and the like as an image and, in a broad sense, a fingerprint detection sensor that detects a distribution of other physical amounts such as a pressure and a capacitance and images it as an image.

Furthermore, the embodiments of the present disclosure are not limited to the embodiments above and can be variously modified without departing from the gist of the present disclosure.

It should be noted that the present disclosure may also take the following structures.

(1) A solid-state image pickup apparatus, including
a crosstalk suppression mechanism included in each pixel arranged in a pixel array, the crosstalk suppression mechanism of a part of the pixels differing from that of other pixels in an effective area of the pixel array.

(2) The solid-state image pickup apparatus according to (1) above,
in which the crosstalk suppression mechanism is a DTI.

(3) The solid-state image pickup apparatus according to (2) above, in which:
the part of the pixels in the effective area of the pixel array are a plurality of phase difference pixels for obtaining a phase difference signal used in an image plane phase difference AF; and
the DTI around a pixel surrounded by the phase difference pixels is removed.

(4) The solid-state image pickup apparatus according to (2) above, in which:
the part of the pixels in the effective area of the pixel array are a plurality of phase difference pixels for obtaining a phase difference signal used in an image plane phase difference AF; and
the DTI is provided only around a pixel surrounded by the phase difference pixels.

(5) The solid-state image pickup apparatus according to (1) above,
in which the crosstalk suppression mechanism is realized by adjusting an ion implantation amount for the pixels arranged in the pixel array.

(6) The solid-state image pickup apparatus according to (5) above, in which:
the part of the pixels in the effective area of the pixel array are a plurality of phase difference pixels for obtaining a phase difference signal used in an image plane phase difference AF; and
an ion implantation amount for an electronic barrier of a pixel surrounded by the phase difference pixels is smaller than that for an electronic barrier of other pixels.

(7) The solid-state image pickup apparatus according to (5) above, in which:
the part of the pixels in the effective area of the pixel array are a plurality of phase difference pixels for obtaining a phase difference signal used in an image plane phase difference AF; and
an ion implantation amount for a sensor area of a pixel surrounded by the phase difference pixels is smaller than that for an electronic barrier of other pixels.

(8) The solid-state image pickup apparatus according to (1) above, in which:
the crosstalk suppression mechanism is an OBB;
the part of the pixels in the effective area of the pixel array are a plurality of phase difference pixels for obtaining a phase difference signal used in an image plane phase difference AF; and
the OBB of a pixel surrounded by the phase difference pixels is removed.

(9) The solid-state image pickup apparatus according to (1) above, in which:
the crosstalk suppression mechanism is a waveguide;
the part of the pixels in the effective area of the pixel array are a plurality of phase difference pixels for obtaining a phase difference signal used in an image plane phase difference AF; and
the waveguide of a pixel surrounded by the phase difference pixels is removed.

(10) The solid-state image pickup apparatus according to (1) above, in which:
the crosstalk suppression mechanism is an on-chip lens;
the part of the pixels in the effective area of the pixel array are a plurality of phase difference pixels for obtaining a phase difference signal used in an image plane phase difference AF; and
the on-chip lens of a pixel surrounded by the phase difference pixels is structured such that a light collection property thereof becomes weak.

(11) The solid-state image pickup apparatus according to (1) above, in which:
the crosstalk suppression mechanism is realized by a color filter;
the part of the pixels in the effective area of the pixel array are a plurality of phase difference pixels for obtaining a phase difference signal used in an image plane phase difference AF; and
only the color filter of a pixel surrounded by the phase difference pixels is white.

(12) The solid-state image pickup apparatus according to any one of (1) to (11) above, in which:
the part of the pixels in the effective area of the pixel array are a plurality of phase difference pixels for obtaining a phase difference signal used in an image plane phase difference AF; and
the color filters of the same color are arranged for the phase difference pixels.

(13) The solid-state image pickup apparatus according to any one of (1) to (12) above, in which:
the part of the pixels in the effective area of the pixel array are a plurality of phase difference pixels for obtaining a phase difference signal used in an image plane phase difference AF; and
a pixel adjacent to a predetermined pixel in a vertical direction and a pixel adjacent to the predetermined pixel in a horizontal direction out of the pixels of the pixel array arranged in a 2D matrix are the phase difference pixels.

(14) The solid-state image pickup apparatus according to any one of (1) to (13) above, in which:
the part of the pixels in the effective area of the pixel array are a plurality of phase difference pixels for obtaining a phase difference signal used in an image plane phase difference AF;
two pixels adjacent to each other in a vertical direction and two pixels adjacent to each other in a horizontal direction out of the pixels of the pixel array arranged in a 2D matrix are the phase difference pixels; and
the two pixels adjacent to each other in the vertical direction and the two pixels adjacent to each other in the horizontal direction are arranged in an L shape.

(15) An electronic apparatus, including
a solid-state image pickup apparatus including a crosstalk suppression mechanism included in each pixel arranged in a pixel array, the crosstalk suppression mechanism of a part of the pixels differing from that of other pixels in an effective area of the pixel array.

It should be understood by those skilled in the art that various modifications, combinations, sub-combinations and alterations may occur depending on design requirements and other factors insofar as they are within the scope of the appended claims or the equivalents thereof.

What is claimed is:
1. A solid-state image pickup apparatus, comprising:
an array of pixels with photoelectric conversion regions separated by electronic barriers;
a first layer containing the photoelectric conversion regions and the electronic barriers;

a second layer on the first layer and containing optical isolation members that prevent stray light from one pixel from entering any other pixel; and a deep trench isolation (DTI) structure optically isolating, except for a pixel surrounded by phase difference pixels used for obtaining a phase difference, the photoelectric conversion regions from each other, the DTI structure effective to prevent light from an isolated photoelectric conversion region isolated by the DTI structure from entering another photoelectric conversion region adjacent to the isolated photoelectric conversion region, the DTI structure located within the electronic barriers.

2. The solid-state image pickup apparatus according to claim 1, wherein the phase difference pixels generate signals that can be used to obtain a phase difference signal used in an image plane phase difference AF.

3. The solid-state image pickup apparatus according to claim 1, wherein the phase difference pixels for obtaining a phase difference signal used in an image plane phase difference AF.

4. The solid-state image pickup apparatus according to claim 1, wherein:
the phase difference pixels for obtaining a phase difference signal are used in an image plane phase difference AF; and
the electronic barriers are ion implantations between the photoelectric conversion regions and an ion implantation amount for an electronic barrier of the pixel surrounded by the phase difference pixels is smaller than that for an electronic barrier of other pixels.

5. The solid-state image pickup apparatus according to claim 1, wherein:
the phase difference pixels for obtaining a phase difference signal are used in an image plane phase difference AF; and
the electronic barriers are ion implantations between the photoelectric conversion regions and an ion implantation amount for a sensor area of the pixel surrounded by the phase difference pixels is smaller than that for an electronic barrier of the other pixels.

6. The solid-state image pickup apparatus according to claim 1, wherein:
the phase difference pixels for obtaining a phase difference signal are used in an image plane phase difference AF; and
an on-chip lens of the pixel surrounded by the phase difference pixels is structured such that a light collection property thereof becomes weak.

7. The solid-state image pickup apparatus according to claim 1, wherein:
the phase difference pixels for obtaining a phase difference signal used in an image plane phase difference AF; and
only a color filter of a pixel surrounded by the phase difference pixels is a white light filter.

8. The solid-state image pickup apparatus according to claim 1, wherein:
the phase difference pixels for obtaining a phase difference signal used in an image plane phase difference AF; and
color filters of a same color are provided for the phase difference pixels.

9. The solid-state image pickup apparatus according to claim 1, wherein:
the phase difference pixels for obtaining a phase difference signal used in an image plane phase difference AF; and
a pixel adjacent to a predetermined pixel in a first direction and a pixel adjacent to the predetermined pixel in a second direction orthogonal to the first direction out of the pixels of the pixel array arranged in a 2D matrix are the phase difference pixels.

10. The solid-state image pickup apparatus according to claim 1, wherein:
the phase difference pixels for obtaining a phase difference signal are used in an image plane phase difference AF;
two pixels adjacent to each other in a first direction and two pixels adjacent to each other in a second direction orthogonal to the first direction out of the pixels of the pixel array arranged in a 2D matrix are the phase difference pixels; and
two pixels adjacent to each other in the first direction and two pixels adjacent to each other in the second direction are arranged in an L shape.

11. The solid-state image sensor of claim 1, wherein the electronic barriers are ion implantations between the photoelectric conversion regions, and the DTI structure comprises oxide regions embedded in trenches in the electronic barriers.

* * * * *